US005615377A

United States Patent [19]

Shimizu et al.

[11] Patent Number: 5,615,377

[45] Date of Patent: Mar. 25, 1997

[54] METHOD OF SIMULATING HOT CARRIER DETERIORATION OF A P-MOS TRANSISTOR

[75] Inventors: Satoshi Shimizu; Shigeru Kusunoki, both of Hyogo, Japan

[73] Assignee: Mitsubishi Denki Kabushiki Kaisha, Tokyo, Japan

[21] Appl. No.: 463,810

[22] Filed: Jun. 5, 1995

[30] Foreign Application Priority Data

Aug. 19, 1994 [JP] Japan .................................... 6-195071

[51] Int. Cl.[6] ............................ G01R 31/26; G06F 9/455

[52] U.S. Cl. .......................... 395/500; 324/765; 324/769; 324/768

[58] Field of Search ............................ 395/500; 257/473; 324/769, 158 R, 765, 766, 768; 437/44

[56] References Cited

U.S. PATENT DOCUMENTS

| | | | |
|---|---|---|---|
| 4,816,753 | 3/1989 | Palkuti | 324/158 R |
| 5,100,820 | 3/1992 | Tsubone | 437/44 |
| 5,508,632 | 4/1996 | Shimizu et al. | 324/769 |
| 5,525,829 | 6/1996 | Mistry | 257/473 |

OTHER PUBLICATIONS

"Dynamic Stress Experiments for Understanding Hot–Carrier Degradation Phenomena", by W. Weber, IEEE Transactions on Electron Devices, vol. 35, No. 9, Sep. 1988, pp. 1476–1486.

"Consistent Model for the Hot–Carrier Degradation in n–Channel and p–Channel MOSFET'S", by Heremans et al., IEEE Transactions on Electron Devices, vol. 35, No. 12, Dec. 1988, pp. 2194–2209.

"A Novel Method for Characterizing Degradation of MOSFET'S Caused by Hot–Carriers", by Acovic et al., IEEE, Low Temperature Semiconductor Electronics, 1989, pp. 118–122.

"Kinetics of Hot Carrier Effects for Circuit Simulation", by S. Aur, Reliability Physics, 1989 IEEE 27th Annual Proceddings, pp. 88–91.

"A New Monitor to Predict Hot–Carrier Damage of PMOS Transistors", by Woltjer et al., IEEE Electron Devices Meeting, 1990, pp. 24.3.1–24.3.4.

"A Lifetime Prediction Method for Hot–Carrier Degradation in Surface–Channel p–MOS Devices", by Doyle et al., IEEE Transactions on Electron Devices, vol. 37, No. 5, May 1990, pp. 1301–1307.

"Hot–Carrier Degradation of Single–Drain PMOSFET's with Differing Sidewall Spacer Thicknesses", by Ahn et al., IEEE Electron Device Letters, vol. 13, No. 4, Apr. 1992, pp. 211–213.

"Channel–Length Independent Hot–Carrier Degradation in Analog p–MOS Operation", by Thewes et al., IEEE Electron Device Letters, vol. 13, No. 11, Nov. 1992, pp. 590–592.

"PMOS Hot–Carrier Rebound and Degradation", by Song et al., IEEE, Electron Devices Meeting, 1993, pp. 20.3.1–20.3.4.

(List continued on next page.)

*Primary Examiner*—Kevin J. Teska
*Assistant Examiner*—Russell W. Frejd
*Attorney, Agent, or Firm*—Lowe, Price, LeBlanc & Becker

[57] ABSTRACT

A method of simulating hot carrier deterioration of a P-MOS transistor uses the following formulas (A1), (A2), (A3) and (A4) or the following formulas (A1), (A5), (A3) and (A4) (A2), and coefficients A, n, B and m are determined by a preliminary measuring experiment, whereby a transistor lifetime τ can be estimated:

$$Vth=Vfb+\sigma\cdot Vd \quad (A1)$$

$$\Delta Vth=\Delta Vfb \quad (A2)$$

$$(\Delta Vfb)_f=A\cdot\sigma^n \quad (A3)$$

$$\tau=B\cdot(Ig/W)^{-m} \quad (A4)$$

$$\Delta Vth=\Delta Vfb+\Delta\sigma\cdot Vd \quad (A5)$$

10 Claims, 16 Drawing Sheets

OTHER PUBLICATIONS

"Hot–Carrier Current Modeling and Device Degradation in . . . ", Ong et al., IEEE Trans. Electron Devices, vol. 37 (1990), pp. 1658–1666.

"Lucky–Electron Model of Channel Hot–Electron Injection . . . ", Tam et al., IEEE Trans Electron Devices, vol. ED–31, Sep. 1984, pp. 1116–1125.

"BSIM: Berkeley Short–Channel IGFET Model for MOS . . . ", Sheu et al., IEEE J. Solid–State Circuits, vol. SC–22, Aug. 1987, pp. 558–566.

"Quasi–Static Simulation of Hot–Electron–Induced MOSFET . . . ", Kuo et al., International Electron Devices Meeting 1987, pp. 47–50.

"A New Bi–directional PMOSFET Hot–Carrier Degradation . . . ", Li et al., International Electron Devices Meeting 1992, pp. 547–550.

F I G. 7
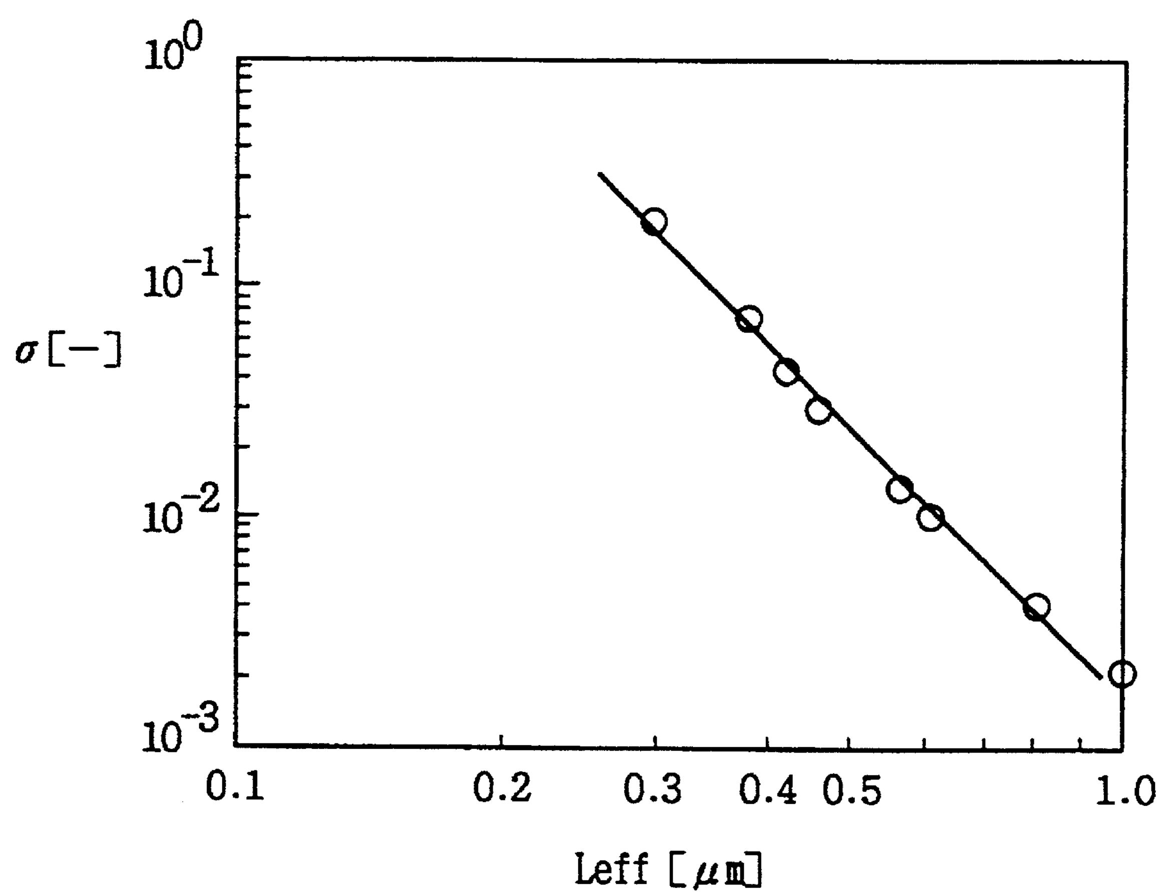

METHOD OF SIMULATING HOT CARRIER DETERIORATION OF A P-MOS TRANSISTOR

BACKGROUND OF THE INVENTION

1. Field of the Invention

The present invention relates to a method of simulating hot carrier deterioration of an MOS transistor, and in particular to a method of simulating hot carrier deterioration of a P-MOS transistor during operation in the FWD and REV modes.

2. Description of the Background Art

Hot carrier deterioration of MOS transistors can be evaluated, for example, based on a rate (ΔId/Id) of a variation ΔId of a drain current to an initial drain current Id or a variation ΔVth of a threshold voltage with respect to an initial threshold voltage Vth.

FIG. 15 is an equivalent circuit diagram showing a concept of the hot carrier deterioration of the MOS transistor which can be found by a conventional simulation method. FIG. 15 shows at (A) a fact that a drain current Id flows in a fresh MOS tr. ansistor before application of a stress. FIG. 15 shows at (B) a fact that a drain current Id' flows through the MOS transistor after hot carrier deterioration. Thus, the hot carrier deterioration changes the drain current flowing through the transistor by ΔId from the initial drain current Id.

A method of simulating hot carrier deterioration of a P-MOS transistor is described, for example, in IEEE Trans. Electron Devices, Vol. 37, pp 1658–1666 (1990) by Ong et al.

Under a static hot carrier stress condition by a DC (direct current), the hot carrier deterioration rate ΔId/Id can be expressed by the following formula (101):

$$\Delta Id/Id=A_{Id}\cdot t^{n} \tag{101}$$

where t represents a hot carrier stress time, characters "A" and "n" represent coefficients which depend on manufacturing process conditions of transistors and stress conditions.

Under the static hot carrier stress condition by DC, the hot carrier deterioration AVth can be expressed by the following formula (102):

$$\Delta Vth=A_{Vth}\cdot t^{n} \tag{102}$$

where t represents a hot carrier stress time, characters "A" and "n" represent coefficients which depend on the manufacturing process conditions of transistors and the stress conditions.

Assuming that a stress time which elapses until the variation rate of drain current attains to $(\Delta Id/Id)_f$ is a lifetime τ of the transistor, the following formula (103) is obtained from the formula (101). For example, the time t at the relationship of $(\Delta Id/Id)_f$=10% is defined as the lifetime τ.

$$(\Delta Id/Id)_f=A_{Id}\cdot \tau^{n} \tag{103}$$

Assuming that the stress time which elapses until the variation rate of threshold voltage attains to $(\Delta Vth)_f$ is a lifetime τ of the transistor, the following formula (104) is obtained from the formula (102). For example, the time t at the relationship of $(\Delta Vth)_f$=10 mV is defined as the lifetime τ.

$$(\Delta Vth)_f=A_{Vth}\cdot \tau^{n} \tag{104}$$

For performing a stress acceleration test of P-MOS transistor, the stress conditions applied to the transistor are determined such that the lifetime of transistor attains to the variation rate of $(\Delta Id/Id)_f$ or $(\Delta Vth)_f$ defined by the above formula (103) or (104) within a measurable time from about 1 to about 100000 seconds. Measurement is performed in an FWD mode, i.e., with the current flow of the same direction as that of current flow between source and drain in the stressed transistor, and also measurement is performed in an REV mode, i.e., with the current flow of the inverted direction. Thereby, the transistor lifetime related to ΔId/Id or ΔVth is obtained at a linear region and a saturated region. The stress voltage used in the acceleration test is determined to set the condition that the hot carrier deterioration quantity attains a maximum value in connection with a certain drain voltage Vd. Thus, in the P-MOS transistor, a gate voltage Vg which maximizes gate current Ig is used.

The above reference (Ong et al.) has proposed a simulation method in which the acceleration test method is expressed in formulas, and the formulas are used for the simulation. According to Ong et al., the lifetime τ of P-MOS transistor is expressed by the following experimental formula (105) using the gate current Ig.

$$\tau=B\cdot W^{m}\cdot Ig^{-m} \tag{105}$$

where W represents a gate width of the transistor, B represents a coefficient depending on the manufacturing process condition of the transistor, and m represents an index which is deemed to be correlated to impact ionization by hot carriers.

From the formulas (103), (104) and (105), coefficients $A_{Id}$ and $A_{Vth}$ can be expresses by the following formulas (106) and (107):

$$A_{Id}=(\Delta Id/Id)_f\cdot(B\cdot W^{-m}\cdot Ig^{-m})^{-n} \tag{106}$$

$$A_{Vth}=(\Delta Vth)_f\cdot(B\cdot W^{m}\cdot Ig^{-m})^{-n} \tag{107}$$

Therefore, the following formulas (108) and (109) are obtained from the formulas (101), (102), (106) and (107):

$$A_{Id}=(\Delta Id/Id)_f\cdot B^{-n}\cdot W^{-mn}\cdot Ig^{mn}\cdot t^{n} \tag{108}$$

$$A_{Vth}=(\Delta Vth)_f\cdot B^{-n}\cdot W^{-mn}\cdot Ig^{mn}\cdot t^{n} \tag{109}$$

For the sake of illustration, the following formula (110) is defined, whereby the formulas (108) and (109) can be changed into the following formulas (111) and (112):

$$F(t)=B^{-n}\cdot W^{-mn}\cdot Ig^{mn}\cdot t^{n} \tag{110}$$

$$\Delta Id/Id=(\Delta Id/Id)_f\cdot F(t) \tag{111}$$

$$\Delta Vth=(\Delta Vth)_f\cdot F(t) \tag{112}$$

Thus, F(t) represents a quantity of stress applied from start of application of the hot carrier stress to a time t.

FIG. 16 is a flow diagram showing steps in a method of simulating hot carrier deterioration of a P-MOS transistor utilizing the formula (111) or (112). In this flow diagram, a step S1 includes sub-steps S1*a*–S1*e* for extracting unknown parameters in the formula (111) or (112) by a preliminary measuring experiment.

In the sub-step S1a, which is executed for determining the gate current Ig in the formula (106) or (107), an experimental formula Ig=g (Vg, Vd) is determined so that it fits to data related to a plurality of measured points in the preliminary measuring experiment. A lucky electron model, which is an example of determining the gate current Ig, is described in IEEE Trans. Electron Device, Vol. ED-31, September 1984, pp. 1116–1125, by Tam et al.

In the sub-step S1b, transistor parameters such as a mobility μs (i.e., degree of movement) of carriers and a flat band voltage Vfb are extracted before application of the DC stress, for example, using a BSIM (Berkeley Short-Channel IGFET Model) method, which is specifically described by IEEE J. Solid-State Circuits, Vol. SC-22, August 1987, pp 558–566 by Sheu et al. In the subsequent sub-step S1c, the DC stress is applied to the transistor. In the sub-step S1d, the transistor parameters after application of the DC stress are extracted.

Extraction of the transistor parameters before and after application of the DC stress is required for coinciding characteristics of the transistor before application of the stress with characteristics of the transistor obtained by simulation, and is also required for estimating correlation between the actual hot carrier deterioration of the transistor after application of the stress and variation of the transistor parameters.

In the sub-step S1e, the coefficient B and index m are extracted based on comparison of the experimental formula (105) and data related to a plurality of measured points in the preliminary experiment.

In a step 2, the formula (111) or (112) is calculated using the parameters extracted in the step Si, whereby the hot carrier deterioration of P-MOS transistor is simulated.

In the simulation of the hot carrier deterioration of P-MOS transistor according to the prior art described above, the BSI method is used to obtain the transistor parameters after application of the DC stress. The transistor models according to the BSI method, however, do not include a model of lowering of the mobility of carriers, which is caused by the interface level or oxide film trap of electrons due to local hot carrier injection. For the coincidence of transistor characteristics after application of the stress, extraction of parameters is performed with various parameters of mobility μs and flat band voltage Vfb, and the simulation is performed with the parameters thus extracted.

In actual transistors, injection of hot carriers causes a difference between transistor characteristics in the FWD and REV modes as shown in FIGS. 17, 18 and 19.

FIG. 17 is a graph showing an example of Vd-Id characteristics in the FWD mode of the P-MOS transistor. In this figure, the solid curves represent the characteristics before application of the stress, and the broken curves show characteristics after application of the stress.

Likewise, FIG. 18 is a graph showing an example of Vd-Id characteristics in the REV mode of the P-MOS transistor. In this figure, the solid curves represent the characteristics before application of the stress, and the broken curves show characteristics after application of the stress.

FIG. 19 shows Vg-Id characteristics and Vg-gm characteristics in the FWD and REV modes of the P-MOS transistor, where gm represents a mutual conductance. In FIG. 19, the stress conditions were determined such that Ig attained a maximum value with Vd=–6.0V, and the stress was applied for 1000 seconds. Circular marks represent the transistor characteristics before application of the stress, triangular marks represent the transistor characteristics in the FWD mode after application of the stress, and square marks represent the transistor characteristics in the REV mode after application of the stress. The drain current Id was measured under two conditions of Vd=–1.5V and Vd=–0.2V.

A difference between the transistor characteristics in the FWD and REV modes is caused due to the fact that the hot carrier injection locally occurs at the vicinity of the drain in the transistor. Therefore, when using the BSI method which is based on a model that the transistor includes symmetrical source/drain, the transistor parameters after application of the stress must be extracted in both the FWD and REV modes.

According to the conventional simulation, it is impossible to simulate the hot carrier deterioration of transistors such as a pass-transistor in a circuit, which performs a bidirectional operation, i.e., which changes a direction of a current flow between source/drain.

SUMMARY OF THE INVENTION

In view of the above-mentioned disadvantages of the prior art, it is an object of the invention to provide a method by which hot carrier deterioration in a P-MOS transistor can be simulated in both the FWD and REV modes, and hot carrier deterioration in a transistor during bidirectional operation can be estimated by simulation with high accuracy.

According to a method of simulating hot carrier deterioration of a P-MOS transistor of an aspect of the invention, the following formulas (A1), (A2), (A3) and (A4) are used in an FWD mode that a direction of current flow between source/drain during application of a stress in a transistor is the same as that during measuring of transistor characteristics:

$$Vth=Vfb+\sigma\cdot Vd \quad (A1)$$

$$\Delta Vth=\Delta Vfb \quad (A2)$$

$$(\Delta Vfb)_f=A\cdot\tau^n \quad (A3)$$

$$\tau=B\cdot(Ig/W)^{-m} \quad (A4)$$

where Vth represents a threshold voltage, Vd represents a drain voltage, Vfb represents a threshold voltage at Vd=0V, Ig represents a gate current, W represents a gate width, ΔVth and ΔVfb represent variations of Vth and Vfd caused by hot carrier deterioration, σ represents a coefficient showing an effect of lowering of an oxide film barrier caused by Vd, and a lifetime τ of a transistor is defined by the formula (A3); and coefficients A, n, B and m are determined by a preliminary measuring experiment, whereby the transistor lifetime τ can be estimated.

According to a method of simulating hot carrier deterioration of a P-MOS transistor of another aspect of the invention, the following formulas (A1), (A5), (A3) and (A4) are used in an REV mode that a direction of current flow between source/drain during application of a stress in a transistor is opposite to that during measuring of transistor characteristics:

$$Vth=Vfb+\sigma\cdot Vd \quad (A1)$$

$$\Delta Vth=\Delta Vfb+\Delta\sigma\cdot Vd \quad (A5)$$

$$(\Delta Vfb)_f=A\cdot\tau^n \quad (A3)$$

$$(\tau=B\cdot(Ig/W)^{-m} \quad (A4)$$

where Vth represents a threshold voltage, Vd represents a drain voltage, Vfb represents a threshold voltage at Vd=0V, Ig represents a gate current, W represents a gate width, σ represents a coefficient showing an effect of lowering of an oxide film barrier caused by Vd, ΔVth, ΔVfb and Δσ represent variations of Vth, Vfd and σ caused by the hot carrier deterioration, and a lifetime τ of a transistor is defined by the formula (A3); and coefficients A, n, B and m are determined by a preliminary measuring experiment, whereby the transistor lifetime $\tau$ can be estimated.

According to the method of simulating the hot carrier deterioration of the P-MOS transistor of the invention, the hot carrier deterioration can be simulated in both the FWD and REV modes. Also according to the invention, parameters which change due to the hot carrier deterioration are selected, a correlation between the parameters is extracted by the preliminary experiment, and the simulation is performed using the correlation, so that the hot carrier deterioration can be simulated with high accuracy.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 7 is a graph showing a relationship between an effective channel length Leff and a DIBL effect $\sigma$ in the P-MOS transistor before application of the hot carrier stress;

DESCRIPTION OF THE PREFERRED EMBODIMENTS

Figure 1:
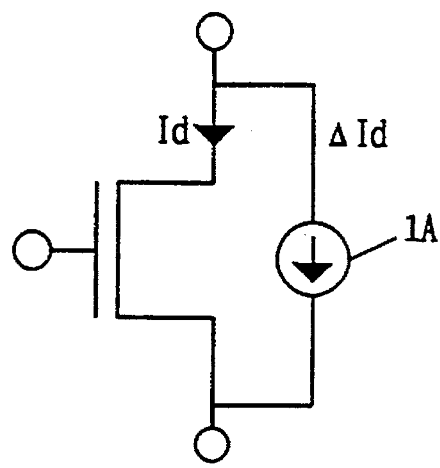
FIG. 1 is an equivalent circuit diagram showing a concept of a simulation method of the invention.
Figure 15A:
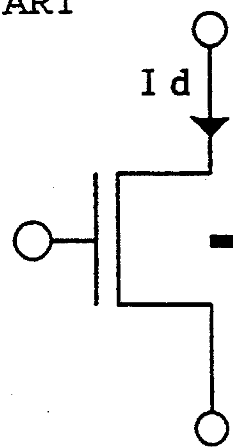
FIG. 15 is an equivalent circuit diagram showing a concept of simulation of hot carrier deterioration of a P-MOS transistor in the prior art.
Figure 15B:
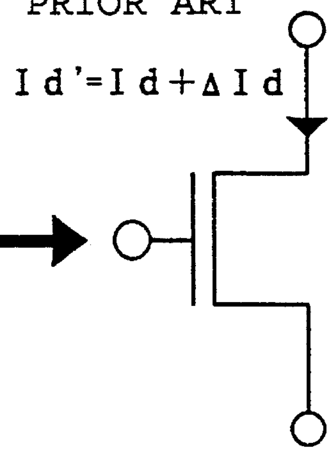
Figure 16:
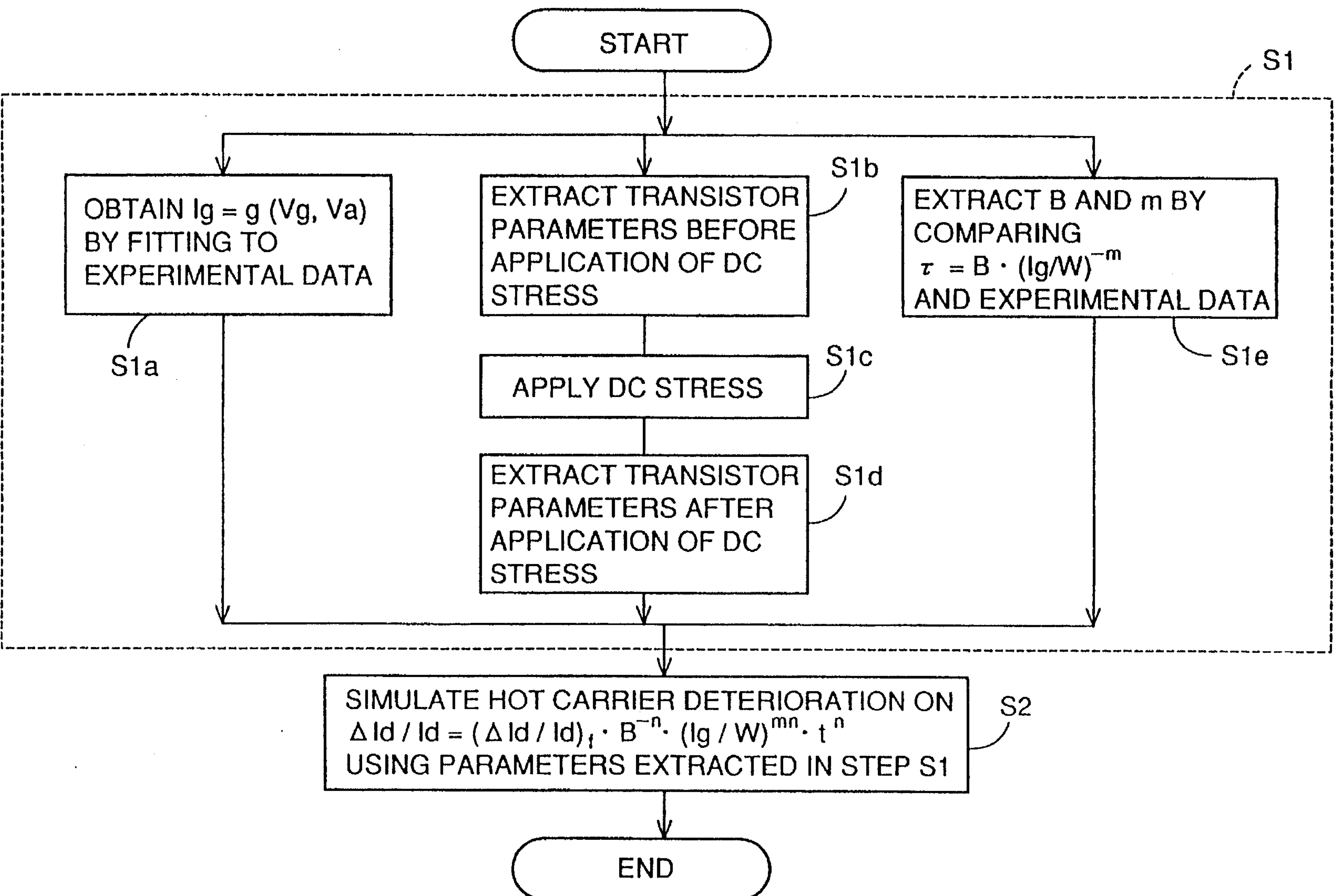
FIG. 16 is a flow diagram showing steps of simulation relating to the hot carrier deterioration of the P-MOS transistor in the prior art.
Figure 17:
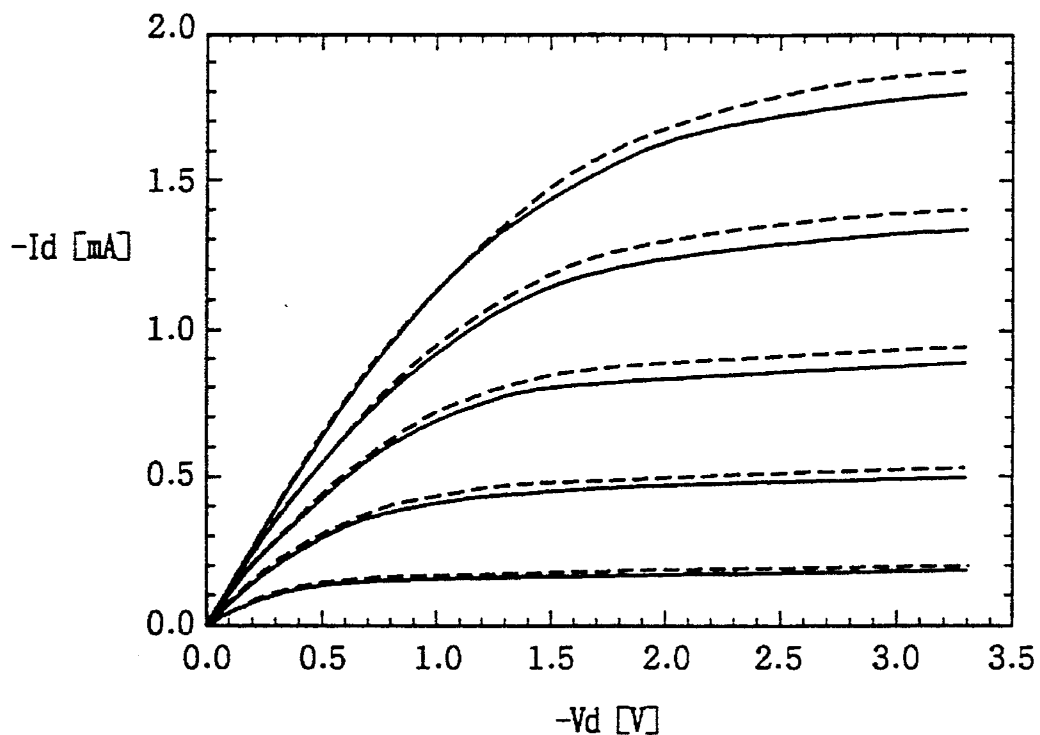
FIG. 17 is a graph showing Vd-Id characteristics measured in the FWD mode before and after application of the stress in the P-MOS transistor.
Figure 18:
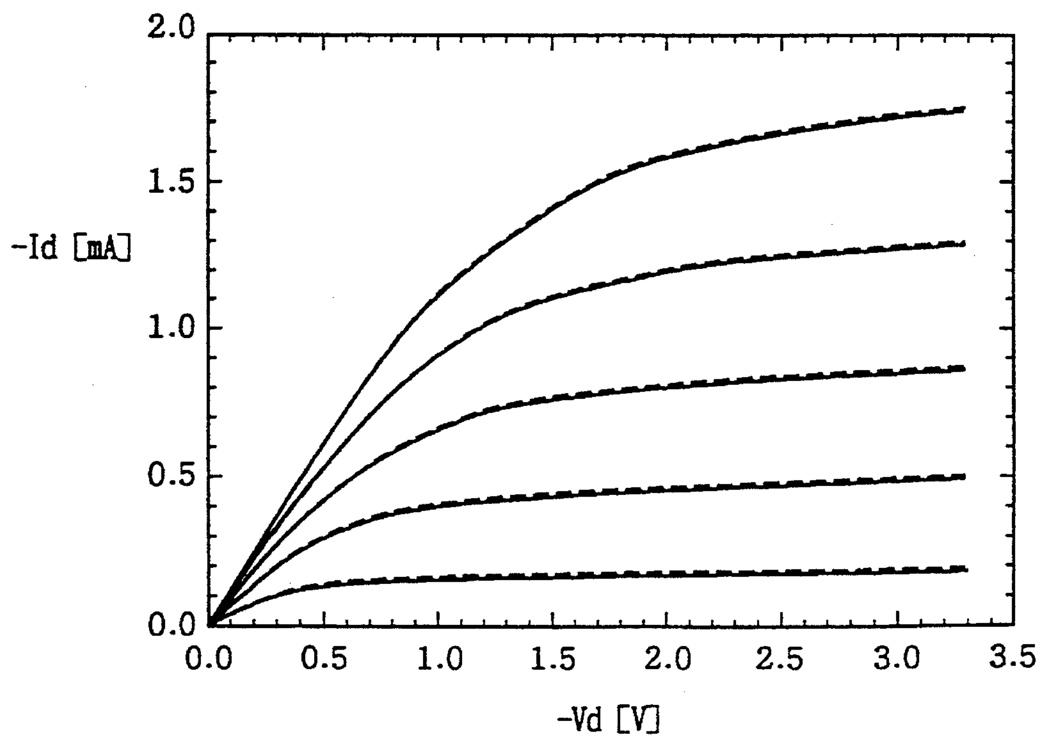
FIG. 18 is a graph showing Vd-Id characteristics measured in the REV mode before and after application of the stress in the P-MOS transistor.
Figure 19:
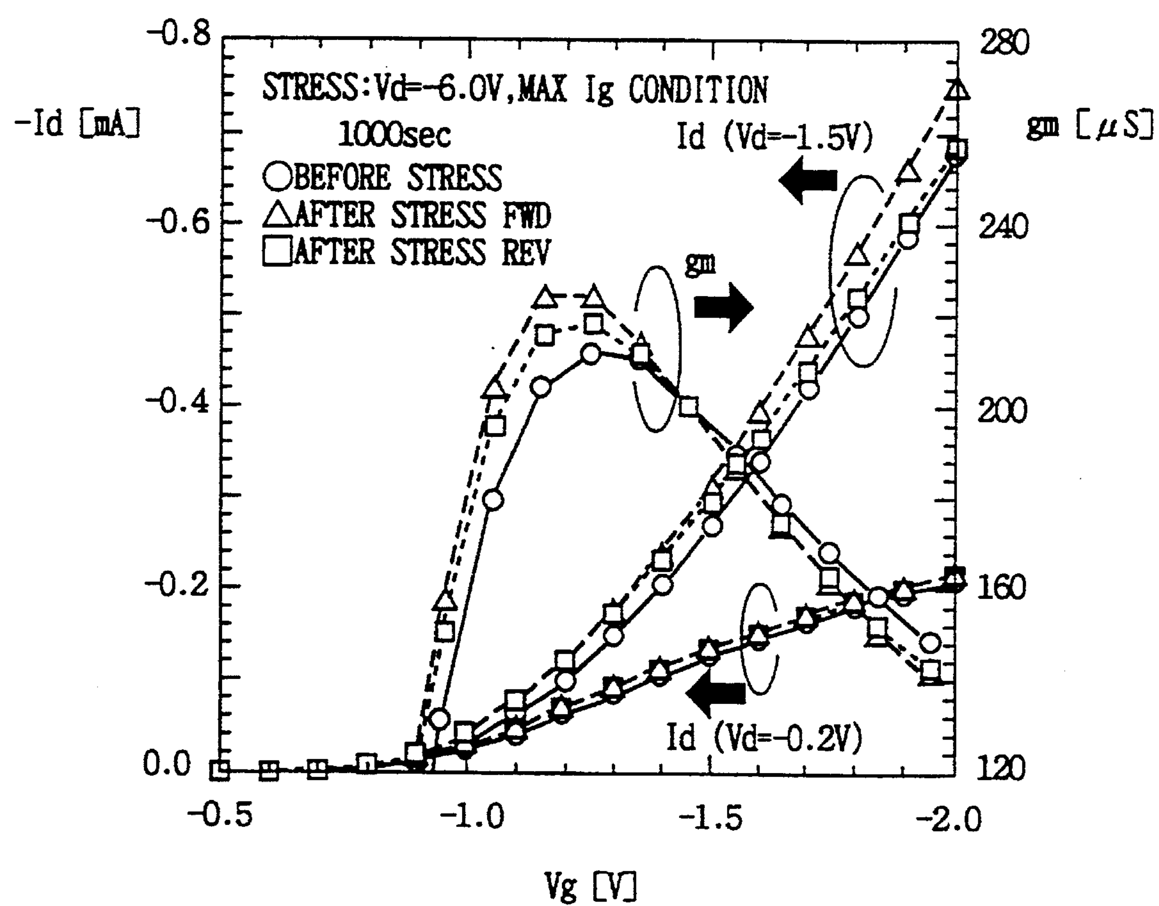
FIG. 19 is a graph showing Vg-Id characteristics at the linear region, Vg-Id characteristics at the saturation region and Vg-gm characteristics which were measured in the FWD and REV modes after and before application of the stress in the P-MOS transistor.

FIG. 1 is an equivalent circuit diagram showing a concept of hot carrier deterioration of a P-MOS transistor according to simulation of the invention. In the conventional simulation, as shown in FIG. 15, injection of hot carriers causes change of transistor parameters in accordance with passage of time, and these transistor parameters are obtained based on a quantity of stress. According to the concept of simulation of the invention, however, the transistor parameters are maintained, and characteristics such as a drain current Id and a threshold voltage Vth which are changed by the hot carriers are represented by an equivalent circuit using a current source 1A of a voltage control type.

The concept of the invention is also characterized in that parameters characterizing the characteristics of voltage control type current source 1A are determined by a preliminary experiment with the hot carrier stress. Further, the concept is characterized in that the parameters which are changed by the hot carrier stress are selected and the hot carrier deterioration is simulated using a correlation between these parameters.

(Embodiment 1)

Figure 2:
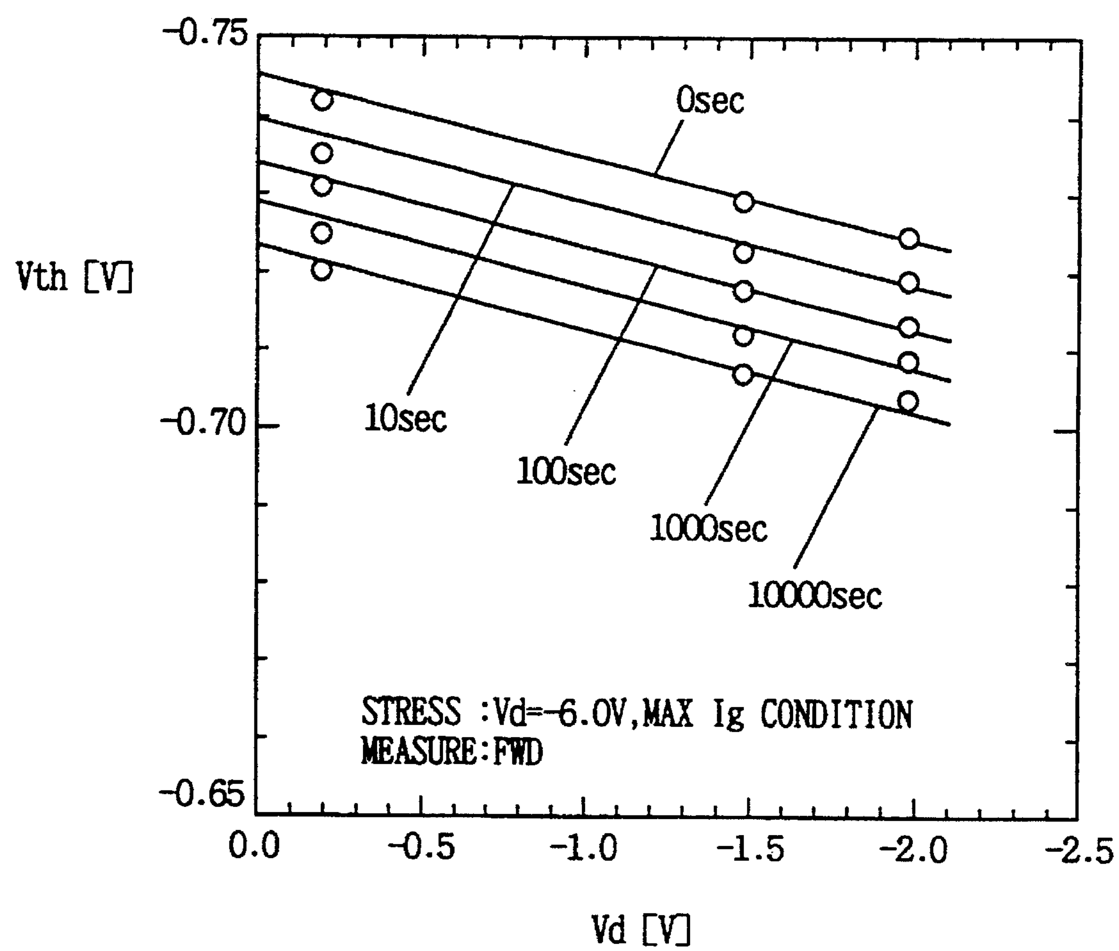
FIG. 2 is a graph showing a relationship between a threshold voltage Vth and a drain voltage Vd in an FWD mode after a hot carrier stress in a P-MOS transistor.

FIG. 2 shows a relationship between drain voltage Vd and threshold voltage Vth measured in an FWD mode after hot carrier deterioration caused by applying a stress voltage to a P-MOS transistor. In FIG. 2, a stress was applied for 0 second, 10 seconds, 100 seconds, 1000 seconds and 10000 seconds under the condition of Vd=−6.0V and the condition that achieves a maximum value of gate current Ig. From the graph of FIG. 2, it can be found that threshold voltage Vth is represented as a linear function of drain voltage Vd expressed by the following formula (1)

$$Vth=Vfb+\sigma\cdot Vd \quad (1)$$

In the graph of FIG. 2, intersections of each line and Vth axis correspond to flat band voltages Vfb, and a gradient of each line corresponds to a DIBL (Drain Induced Barrier Lowering) effect u by the drain voltage.

It can be seen from FIG. 2 that flat band voltage Vfb changes depending on the stress time, but the DIBL effect $\sigma$ is constant (gradient of each line is constant). Therefore, variation AVth of threshold voltage in the FWD mode is expressed by the following formula (2):

$$\Delta Vth=\Delta Vfb \quad (2)$$

Figure 3:
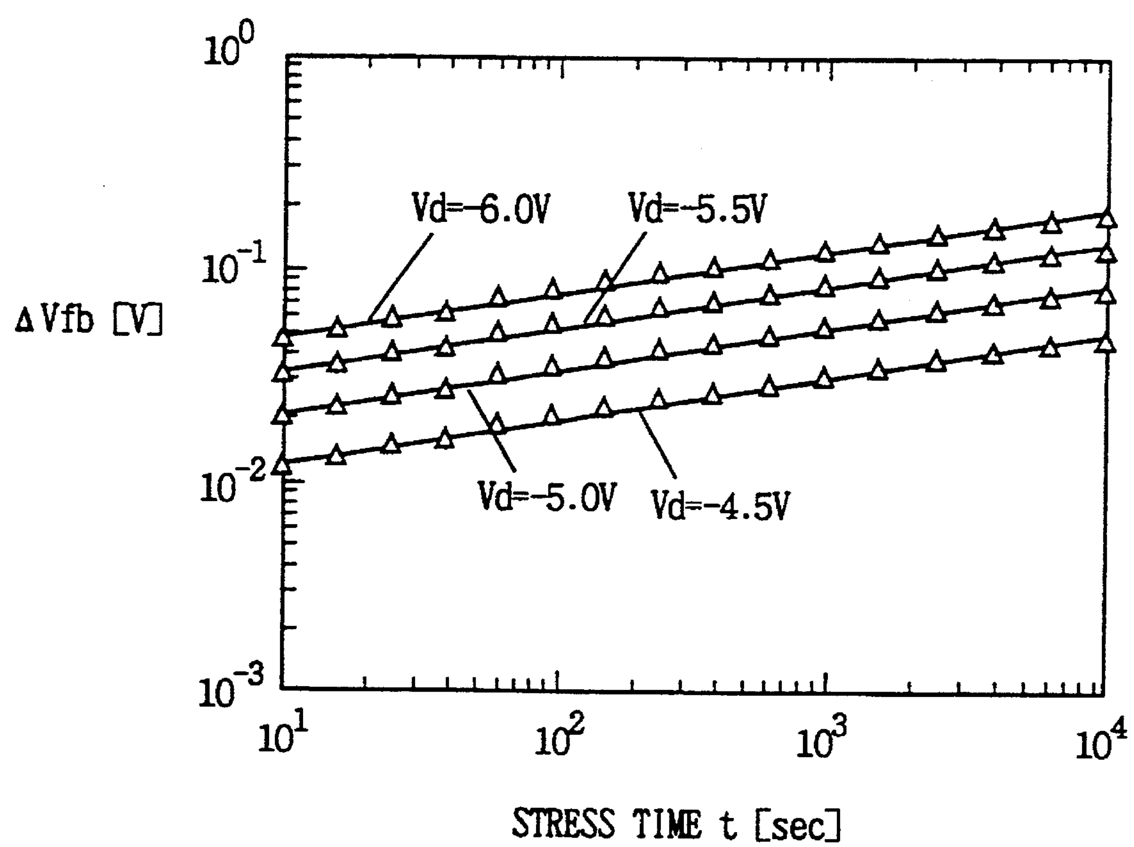
FIG. 3 is a graph showing a relationship between a variation ΔVfb of a flat band voltage and a stress time in the FWD mode.
Figure 4:
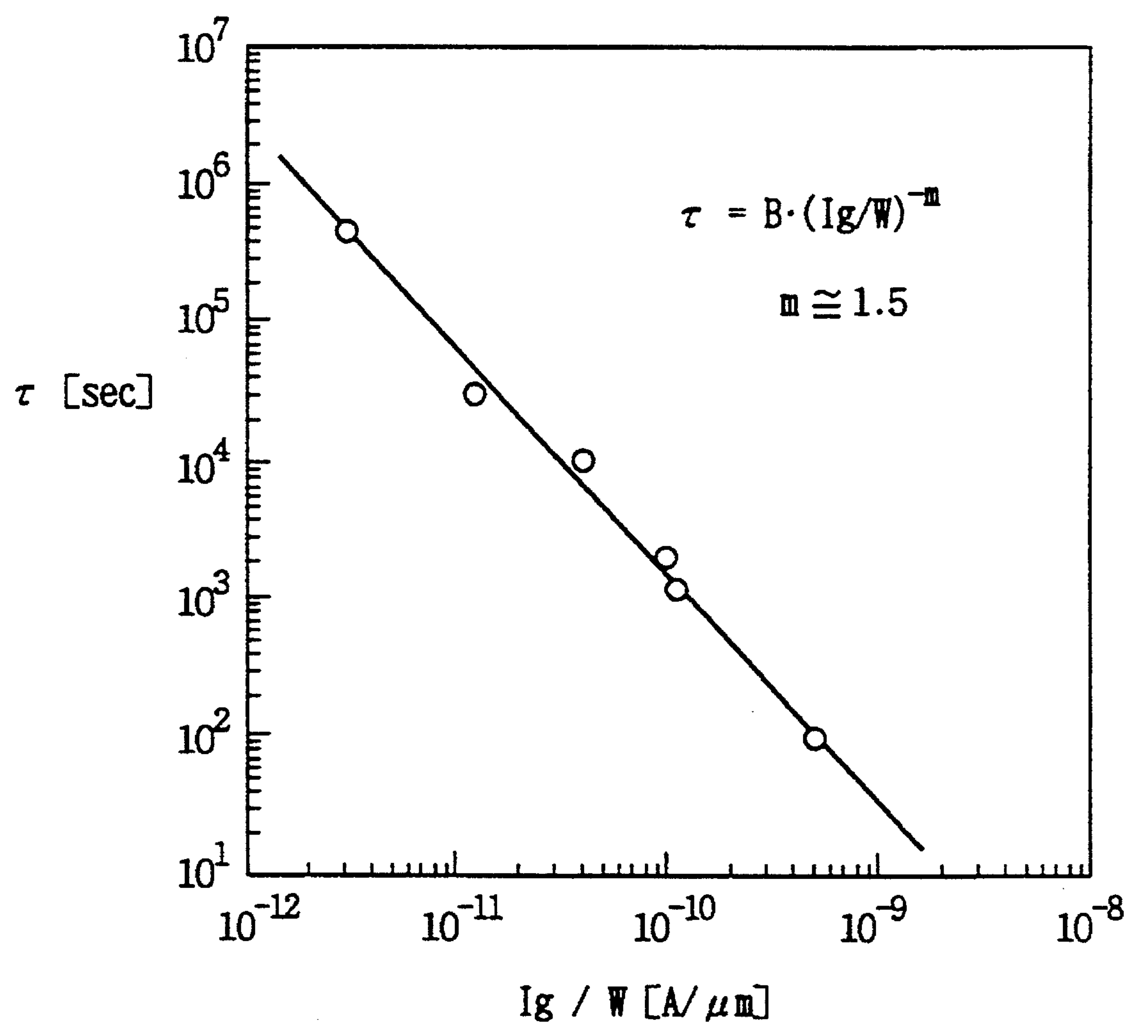
FIG. 4 is a graph showing a relationship between a lifetime $\tau$ affected by hot carrier deterioration and a gate current Ig in a P-MOS transistor.

In FIG. 3, a relationship between variation ΔVfb of the flat band voltage and the stress time in the FWD mode is plotted on a Log-Log scale. In FIG. 3V, –4.5V, –5V, –5.5V and –6V were applied as the drain voltage during a stress period. Gate voltage Vg was applied under the condition that gate current Ig attained a maximum value for maximizing the hot carrier variation.

It can be seen from the graph of FIG. 3 that variation ΔVfb of the flat band voltage can be expressed by the following formula (3) which is similar to the formula (102):

$$\Delta Vfb=A\cdot t^{n} \quad (3)$$

where A and n are coefficients depending on manufacturing process conditions of the transistor and stress conditions.

Therefore, by defining, for example, that lifetime τ of a transistor expires when $(\Delta Vfb)_r$ attains to 10 mV, lifetime τ can be expressed by the following formula (4).

$$\tau=\{(\Delta Vfb)_r/A\}^{1/n} \quad (4)$$

FIG. 4 is a graph showing a relationship between lifetime τ and gate current Ig, and it can be seen that lifetime τ can be expressed by the following formula (5) similarly to the formula (105):

$$\tau=B\cdot(Ig/W)^{-m} \quad (5)$$

Therefore, coefficient A in the formula (3) can be expressed by the following formula (6) similar to the formula (107):

$$A=A_{Vfb}=(\Delta Vfb)_r\cdot(B\cdot W^{m}\cdot Ig^{-m})^{-n} \quad (6)$$

Therefore, variation AVfb of the flat band voltage can be expressed by the following formula (7) similar to the formula (109)

$$\Delta Vth=(\Delta Vth)_r\cdot B^{-n}\cdot W^{mn}\cdot Ig^{mn}\cdot t^{n} \quad (7)$$

By extracting coefficients B, m and n in the formula (7) by a preliminary experiment, simulation can be performed to obtain flat band voltage Vfb after the hot carrier deterioration or threshold voltage Vth in the FWD mode of the P-MOS transistor.

More specifically, in the FWD mode of the embodiment 1, threshold voltage Vth after the application of stress can be simulated with high accuracy by changing flat band voltage Vfb by ΔVfb, because DIBL effect σ does not change.

(Embodiment 2)

Figure 5:
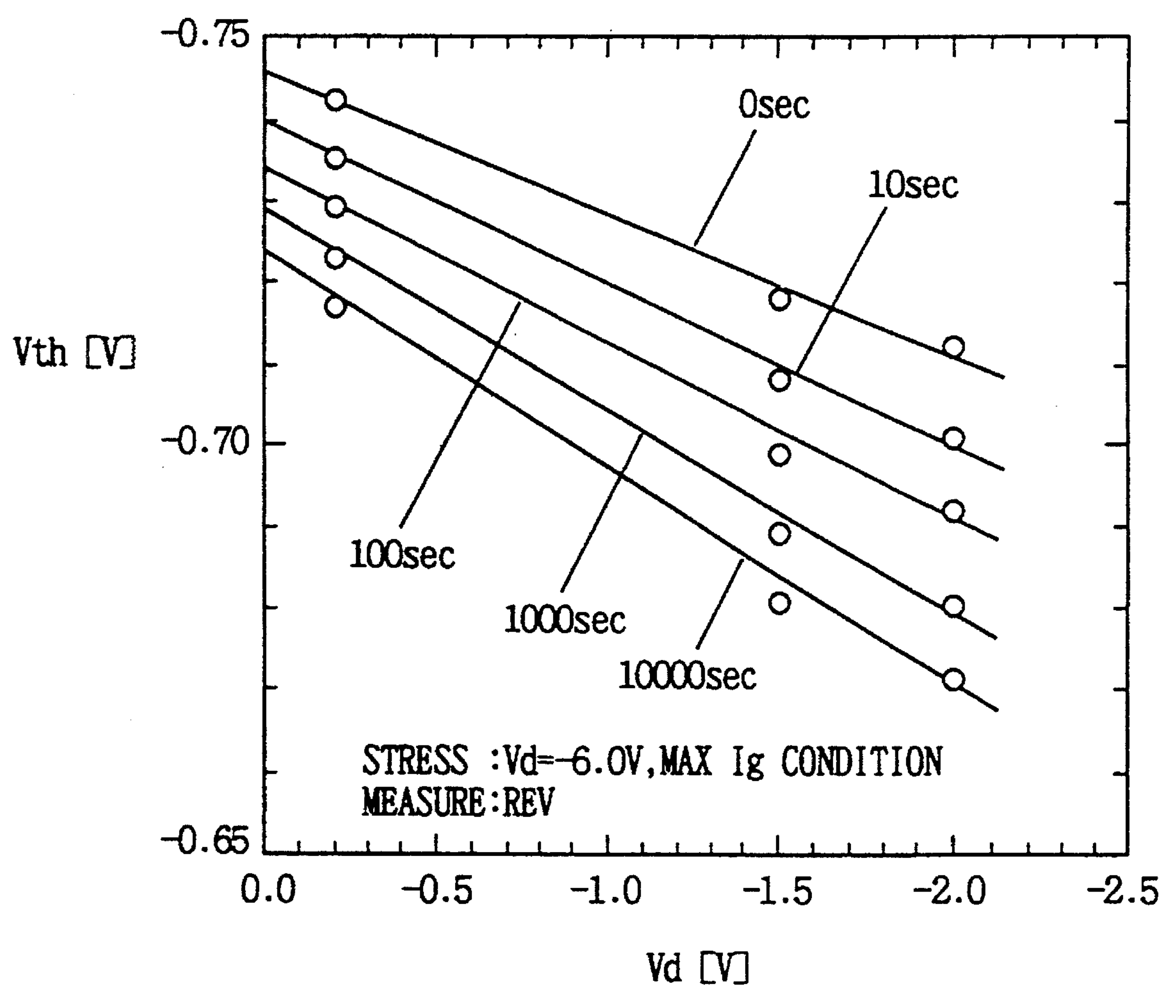
FIG. 5 is a graph showing a relationship between a threshold voltage Vth and a drain voltage Vd in an REV mode after a hot carrier stress in the P-MOS transistor.

FIG. 5 shows a relationship between threshold voltage Vth and drain voltage Vd which were measured in the REV mode when a stress voltage was applied in the P-MOS transistor to generate the hot carrier deterioration. The stress conditions in FIG. 5 are the same as those in FIG. 2. In the graph of FIG. 5, the gradients of straight lines increase as the stress time increases. Thus, it can be seen that the absolute value of DIBL effect σ in the formula (1) increases as the stress time increases. Therefore, variation ΔVth of threshold voltage in the REV mode is expressed not by the formula (2) but by the following formula (8).

$$\Delta Vth=\Delta Vfb+\Delta\sigma\cdot Vd \quad (8)$$

From comparison between FIGS. 5 and 4, it can be found that flat band voltage Vfb changes by the same amount of ΔVfb depending on the stress time in both the FWD and REV modes. Thus, it can be found that the change by ΔVfb of the flat band voltage is based on the oxide film trap of electrons caused by hot carrier injection.

Therefore, variation ΔVfb of the flat band voltage in the REV mode can be obtained similarly to the embodiment 1. By taking variation ΔVfb of the flat band voltage thus obtained as well as variation Δσ of the DIBL effect into consideration, it is possible to obtain variation ΔVth of the threshold voltage in the REV mode after the hot carrier deterioration based on the formula (8).

Thus, in the REV mode of the embodiment 2, Vth in the REV mode after the hot carrier deterioration can be simulated with high accuracy by taking variation ΔVfb of the flat band voltage depending on the stress time as well as variation Δσ of the DIBL effect σ depending on the stress time into consideration.

(Embodiment 3)

Figure 6:
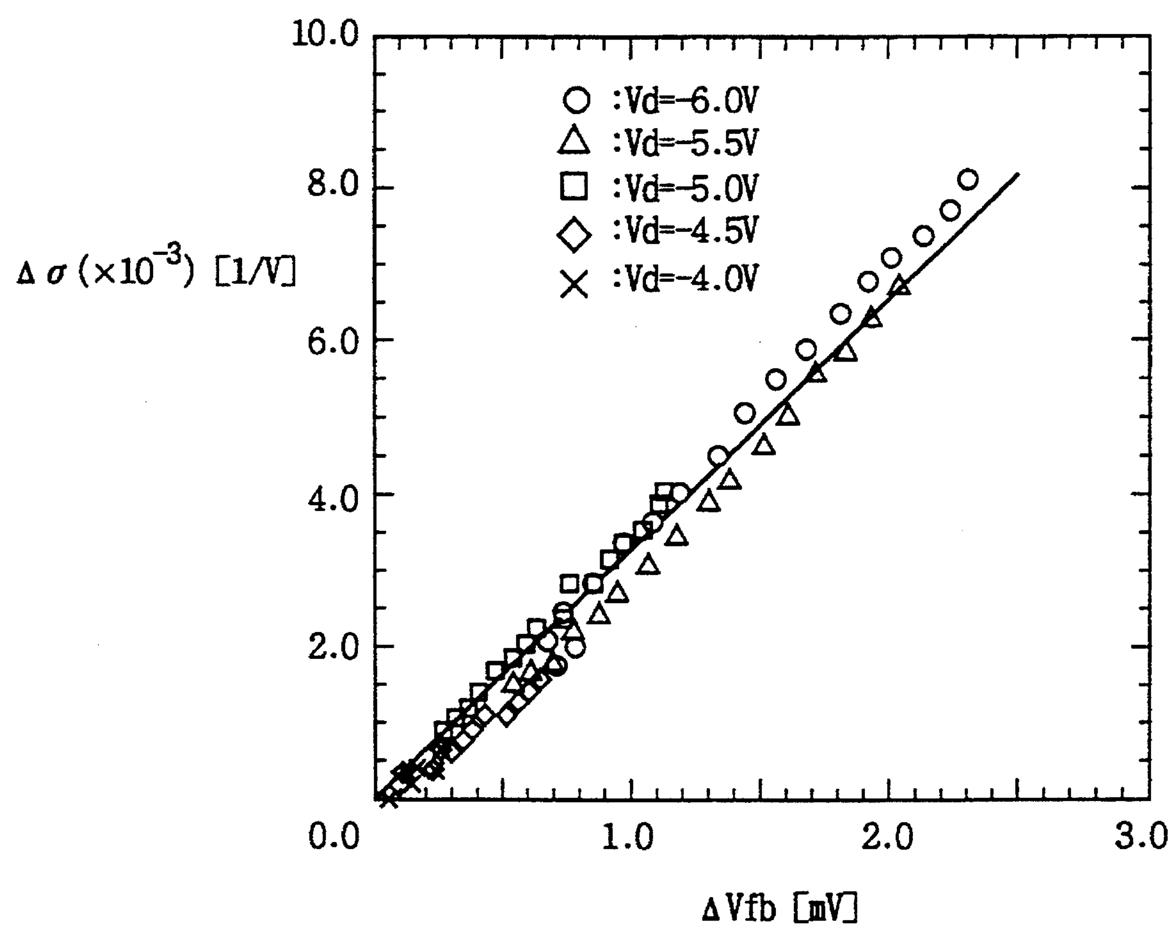
FIG. 6 is a graph showing a relationship between a variation ΔVfb of a flat band voltage and a variation $\Delta\sigma$ of a DIBL effect in the REV mode.

FIG. 6 shows a relationship between variation ΔVfb of the flat band voltage and variation Δσ of the DIBL effect in the REV mode which was found when the hot carrier deterioration was caused by application of the stress voltage in the P-MOS transistor. As the stress conditions, drain voltage Vd of –4.5V, –5.0V, –5.5V or –6.0V was applied. Gate current Vg was applied under the conditions that gate current Ig attained a maximum value. From FIG. 6, it can be seen that ΔVfb and Δσ are expressed by the following formula (9) regardless of a value of drain voltage Vd.

$$\Delta\sigma=C1\cdot\Delta Vfb \quad (9)$$

where coefficient C1 depends on manufacturing process conditions, a thickness of a gate oxide film and a gate length.

From a relationship between the formulas (8) and (9), variation ΔVth of the threshold voltage in the REV mode can be obtained from the following formula (10):

$$\Delta Vth=(1+C1\cdot Vd)\cdot\Delta Vfb \quad (10)$$

Therefore, simulation can be performed to obtain variation ΔVth of the threshold voltage by obtaining variation ΔVfb of the flat band voltage, which can be obtained by extracting coefficients B, m and n in the formula (1) described in the embodiment (1) by the preliminary experiment, and by determining coefficient C1 in the formula (9) by the preliminary experiment.

Thus, in the REV mode of the embodiment (3), threshold voltage Vth after application of the stress can be simulated with high accuracy only by obtaining ΔVfb, if the preliminary experiment is performed to determine coefficient C1 which determines a relationship between variation ΔVfb of the flat band voltage and variation do of the DIBL effect.

(Embodiment 4)

FIG. 7 shows a relationship between effective channel length Leff and DIBL effect o in the P-MOS transistor before application of the hot carrier stress. In the graph of FIG. 7, the relationship between Leff and σ is expressed by the following formula (11), where a coefficient C2 depends on the manufacturing process conditions and the thickness of the gate oxide film.

$$Leff\propto\sigma^{1/C2} \quad (11)$$

Since the hot carrier stress may change DIBL effect σ as stated in the embodiment 2, variation Δσ of the DIBL effect and the formula (11) can be used to express, as the following formula (12), a shortening Let of effective channel length Leff which occurs due to the oxide film trap of electrons caused by the hot carrier stress:

$$(Leff-Let)/Leff=\{(\sigma+\Delta\sigma)/\sigma\}^{1/C2} \quad (12)$$

The formula (12) can be changed into the following formula (13):

$$Let=Leff\cdot[\{1-\{(\sigma+\Delta\sigma)/\sigma\}^{1/C2}] \quad (13)$$

By determining coefficient C2 by the preliminary experiment, therefore, shortening Let of the effective channel length can be obtained. By incorporating this Let into the parameters of the P-MOS transistor subjected to the hot carrier stress as is done in an embodiment which will be described layer, the change of transistor characteristics caused by the hot carrier deterioration can be simulated more accurately.

Thus, in the embodiment 4, shortening Let of the effective channel length can be quantitatively obtained using DIBL effect $\sigma$ and variation $\Delta\sigma$ of the DIBL effect caused by the hot carrier stress. By utilizing this Let, the hot carrier deterioration of the P-MOS transistor can be simulated more accurately.

(Embodiment 5)

Figure 8:
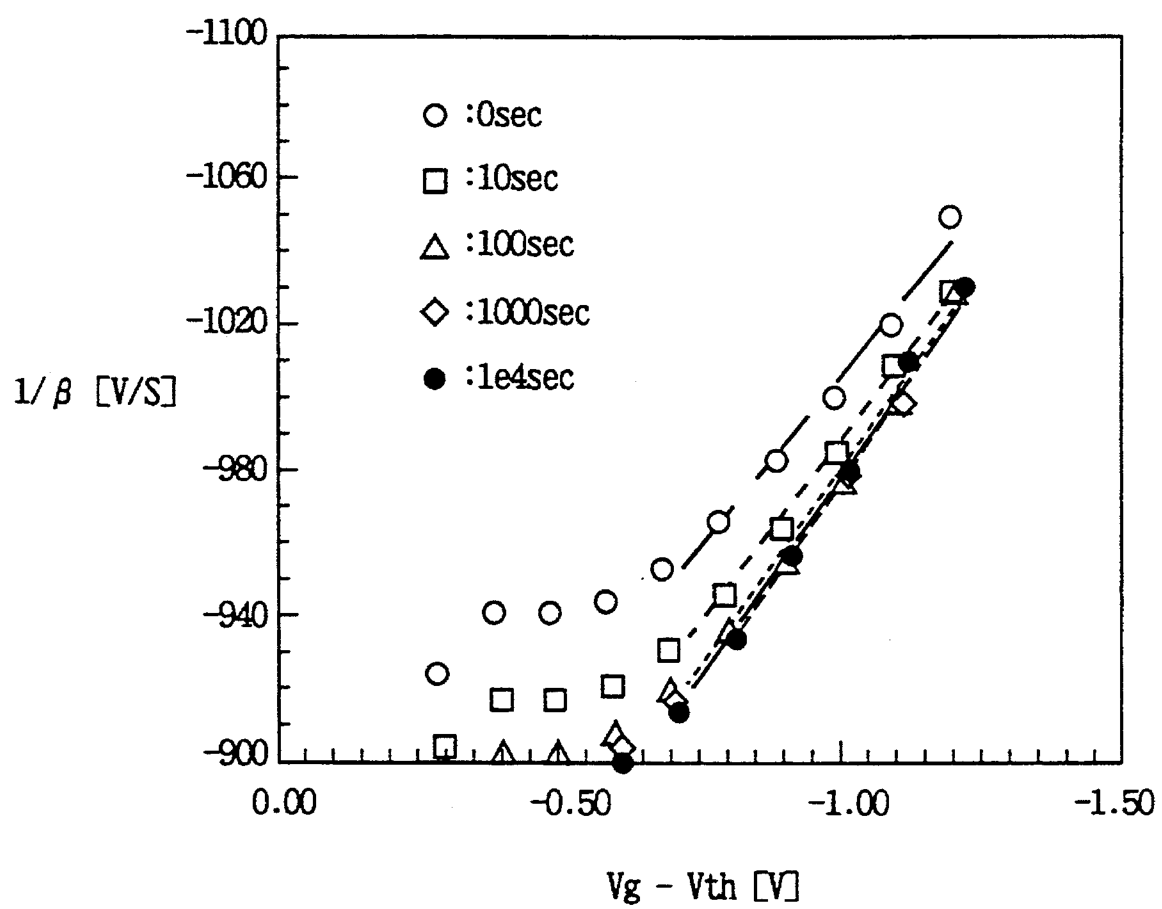
FIG. 8 is a graph prepared by plotting $1/\beta$ in connection with differences of gate voltages Vg and threshold voltages Vth before and after application of the hot carrier stress in the P-MOS transistor.

In FIG. 8, $1/\beta$ is plotted in connection with a difference between measured gate voltage Vg and threshold voltage Vth. Circular, square, triangular, diamond-shaped and solid circular marks represent the measured results after the stress time of 0 second, 10 seconds, 100 seconds, 1000 seconds and 10000 seconds.

$\beta$ is defined in the linear region of the transistor by the following formula (14):

$$\beta=(\partial Id/\partial Vg)/Vd \quad (14)$$

$\beta$ is used in the following model formula (15) of the drain current in the linear region, and is expressed by the following formula (16):

$$\begin{aligned} Id &= \beta \cdot Vd \cdot (Vg - Vth - Vd/2) \quad (15) \\ &= W \cdot (Cox/Leff) \cdot [\mu s/\{1 + \mu s \cdot (Vd/Vmax)/Leff\}] \cdot \\ &\quad Vd \cdot (Vg - Vth - Vd/2) \end{aligned}$$

$$\beta = W \cdot (Cox/Leff) \cdot [\mu s/\{1 + \mu s \cdot (Vd/Vmax)/Leff\}] \quad (16)$$

where Cox represents a capacitance of a gate oxide film, and Vmax represents a saturation speed.

It has been known that the carrier mobility $\mu s$ can be expressed by the following formula:

$$\mu s=U0/\{1+\theta(Vg-Vth)\} \quad (17)$$

where U0 represents the mobility when Vg is equal to Vth, and $\theta$ represents dependency of the mobility on the vertical electric field.

Therefore, the formula (16) can be changed into the following formula (16a):

$$1/\beta=\{(Leff/W)/Cox\}\cdot\{1/U0+\theta\cdot(Vg-Vth)/U0\}+\{(Vd/Vmax)/W\}/Cox \quad (16a)$$

Since saturation speed Vmax is an invariable physical quantity which does not depend on the hot carrier stress, $\beta$ in a region where |Vg| is larger than |Vth| by a relatively large amount can be approximately expressed as a linear function of Vg, whereby a proportionality constant al of the linear function can be expressed as the following formula (18a) based on the formula (16a):

$$a1=Leff\cdot\{(\theta/W)/Cox\}/U0 \quad (18a)$$

An intercept b1 of $1/\beta$ axis at Vg=Vth can be expressed by the following formula (18b) based on the formula (16a):

$$b1=\{(Leff/W)/Cox\}/U0+\{(Vd/Vmax)/W\}/Cox \quad (18b)$$

Based on the formulas (18a) and (18b), therefore, dependency $\theta$ of the mobility on the vertical electric field can be expressed by the following formula (19):

$$\theta=a1/[b1-\{(Vd/Vmax)/W\}/Cox] \quad (19)$$

In the graph of FIG. 8, it can be seen that the proportionality constant al in the relationship between $1/\beta$ and (Vg-Vth) changes depending on the stress time. The change of proportionality constant al depends on variation $\Delta\theta$ of dependency $\theta$ of the mobility on the vertical electric field in the formula (17).

Figure 9:
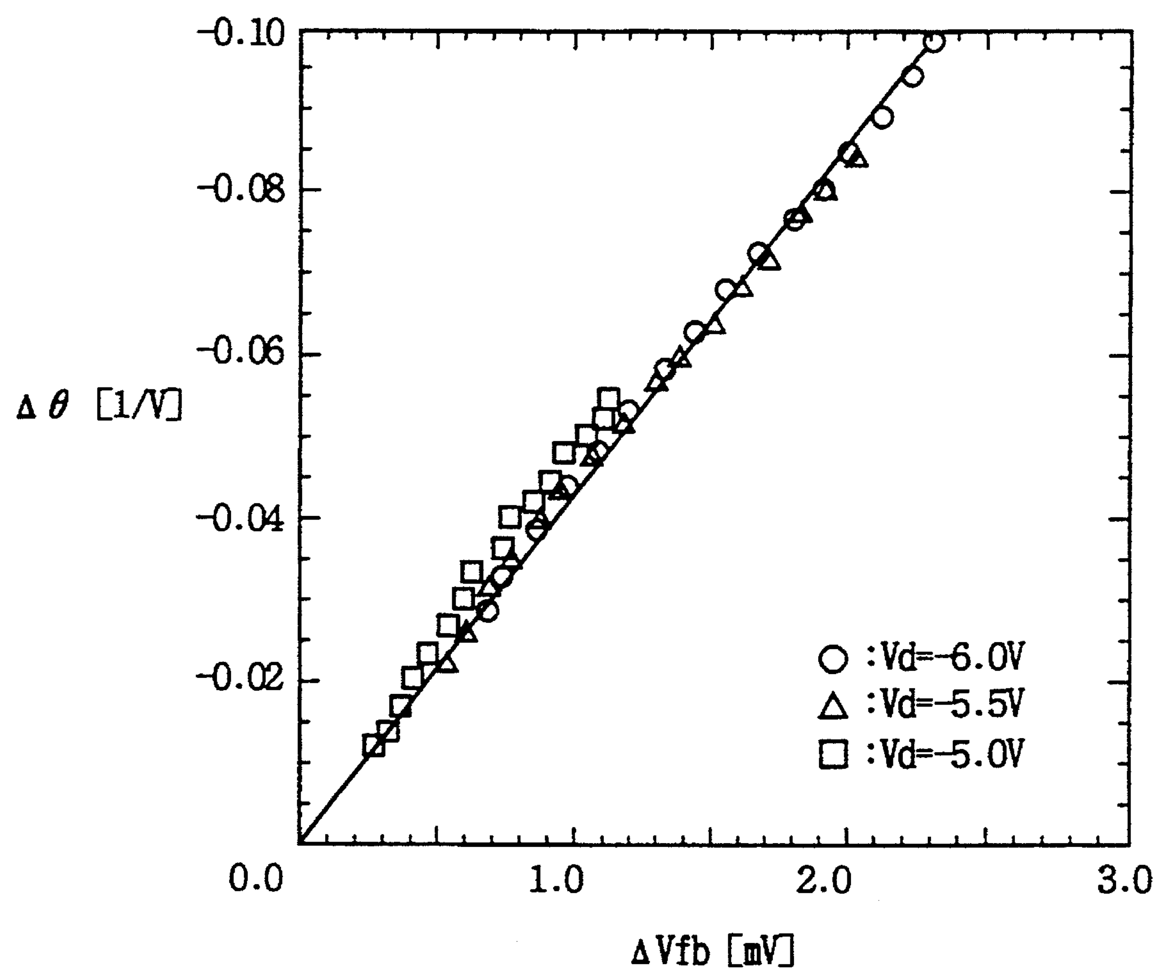
FIG. 9 is a graph showing a relationship between a variation $\Delta\theta$ of dependency of a carrier mobility on a vertical field effect and a variation ΔVfb of a flat band voltage after the hot carrier deterioration in the P-MOS transistor.

In FIG. 9, there is shown a relationship between variation $\Delta Vfb$ of the flat band voltage shown in the embodiments 1 and 2 and variation $\Delta\theta$ of dependency of the mobility on the vertical electric field. Circular, triangular and square marks show the stress with drain voltage Vd of −6.0V, −5.5V and −5.0V, respectively. $\Delta\theta$ can be calculated with the formula (19). As can be seen from the graph of FIG. 9, there is a linear relationship between $\Delta\theta$ and $\theta Vfb$, which can be expressed by the following formula (20):

$$\Delta\theta=C3\cdot\Delta Vfb \quad (20)$$

where C3 is a constant depending on the manufacturing process conditions, the thickness of gate oxide film and the gate length.

By determining the coefficient C3 by the preliminary experiment, therefore, it is possible to simulate variation $\Delta\theta$ of the dependency of the carrier mobility on the vertical electric field in the drain current after the hot carrier stress, using variation $\Delta Vfb$ of the flat band voltage obtained in the embodiment 1 or 2.

Thus, in the embodiment 5, coefficient C3 is extracted by the preliminary experiment, and thereby it is possible to obtain variation $\Delta\theta$ of the dependency of the carrier mobility on the vertical electric field having a close relationship with the drain current characteristics after the hot carrier deterioration of the P-MOS transistor. Accordingly, mobility $\mu s$ after the hot carrier stress can be accurately simulated based on the formula (17).

(Embodiment 6)

As already described in connection with FIG. 8, it is known that the formula (16a) can express $1/\beta$ in the region where |Vg| is relatively large with respect to |Vth|. Also, dependency $\theta$ of the mobility on the vertical electric field can be obtained from the formula (19). Therefore, mobility U0 at Vg=Vth can be expressed by the following formula (21) based on the formula (18a):

$$U0=Leff\cdot\{(\theta/W)/Cox\}/a1 \quad (21)$$

U0 can also be obtained from the following formula (22) using an intercept b1 of $1/\beta$ axis at Vg=Vth in FIG. 8.

$$U0=W\cdot Cox\cdot b1/Leff-(Vd/Vmax)/Leff \quad (22)$$

In FIG. 8, intercept b1 of $1/\beta$ axis at Vg=Vth changes depending on the hot carrier stress time. It can be seen from the formula (18b) that the change of intercept b1 is based on change (Leff-Let) of Leff and change $\Delta$U0 of U1. Change $\Delta$U0 of U0 can be obtained by incorporating shortening Let of Leff, which is obtained in the embodiment 4, into the formula (21) or (22).

Figure 10:
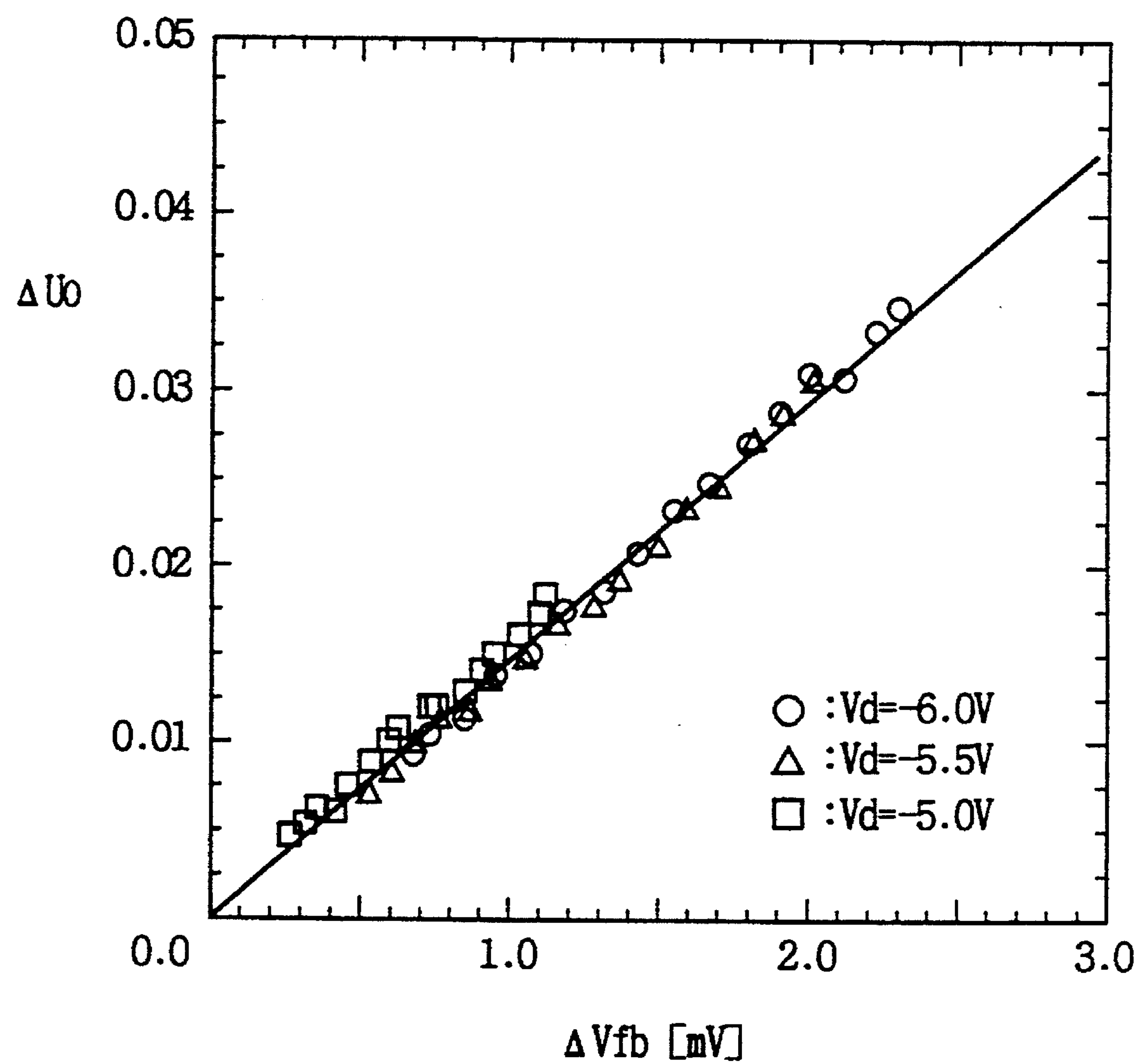
FIG. 10 is a graph showing a relationship between variation ΔU0 of the mobility and variation ΔVfb of the flat band voltage with Vg=Vth after hot carrier deterioration in the P-MOS transistor.

FIG. 10 shows a relationship between change $\Delta$U0 of the mobility at Vg-Vth obtained as described above and variation $\Delta Vfb$ of the flat band voltage obtained in the embodiment 1 or 2. In the graph of FIG. 10, circular, triangular and square marks represent the stress with the drain voltage of −6.0V, −5.5V and −5.0V, respectively. It can be seen from the graph of FIG. 10 that ΔUO and ΔVfb have a linear relationship, and can be expressed by the following formula (23):

$$\Delta U0 = C4 \cdot \Delta Vfb \quad (23)$$

where C4 is a constant depending on the manufacturing process conditions, the thickness of gate oxide film and the gate length.

By determining the coefficient C4 by the preliminary experiment, therefore, it is possible to simulate variation ΔU0 of the carrier mobility at Vg=Vth after the hot carrier stress based on ΔVfb obtained in the embodiment 1 or 2.

Thus, according to the embodiment 6, the coefficient C4 is determined by the preliminary experiment, and thereby it is possible to obtain the variation ΔU0 of the carrier mobility under the condition of Vg-Vth after the hot carrier stress, so that it is possible to simulate accurately the carrier mobility having a close relationship with the drain current of the P-MOS transistor.

(Embodiment 7)

Figure 11:
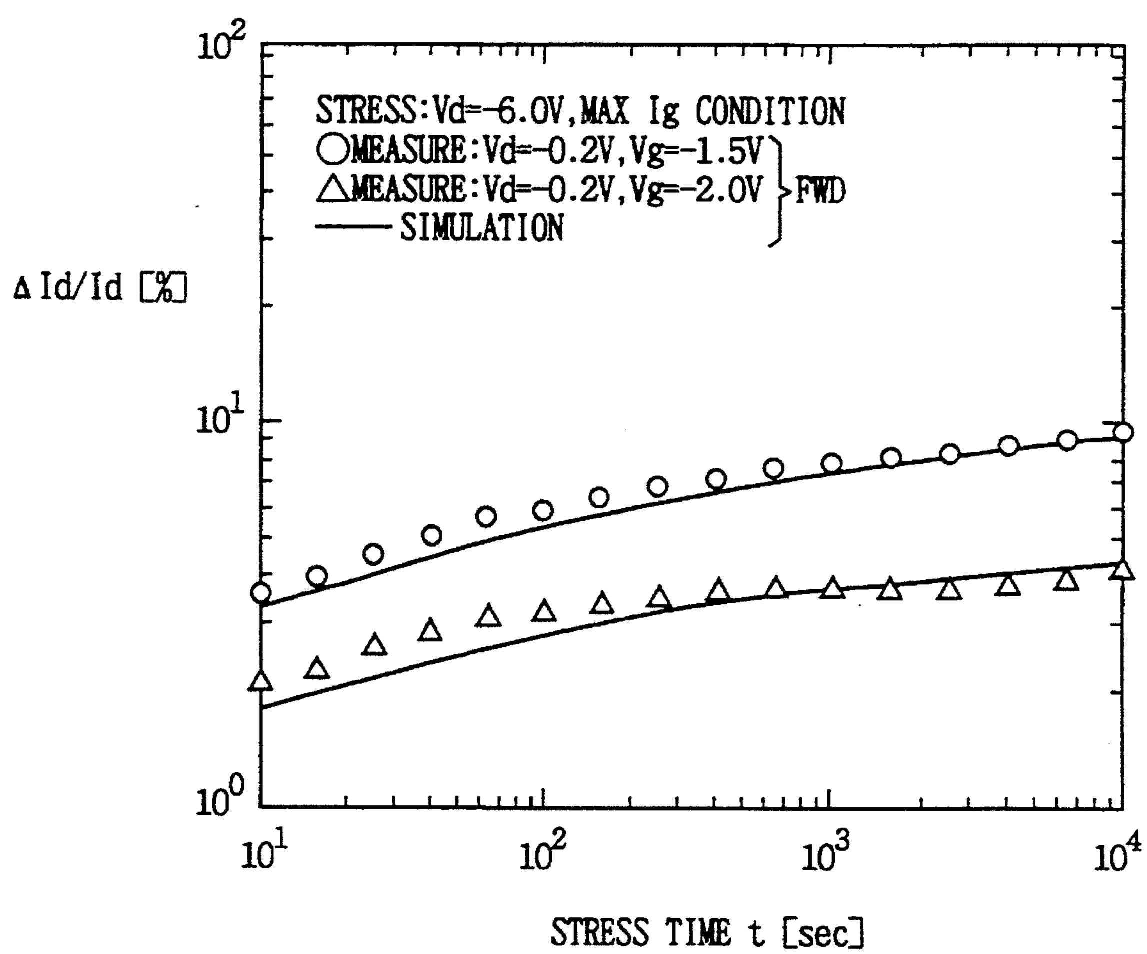
FIG. 11 is a graph showing a relationship between variation rate ΔId/Id of the drain current and the stress time at a linear region in the FWD mode after the hot carrier stress in the P-MOS transistor.

In FIG. 11, a relationship between variation rate ΔId/Id of the drain current and the stress time during the FWD mode in the linear region of the P-MOS transistor is plotted on the Log-Log scale. For the stress conditions, drain voltage Vd of −6.0V and gate voltage Vg achieving the maximum gate current were applied. In the graph of FIG. 11, circular marks represent the results of measurement with Vd=−0.2V and Vg=−1.5V, and triangular marks represent the results of measurement with Vd=−0.2V and Vg=−2.0V. Solid curves represent the results obtained by the simulation.

It has been known that drain current Id in the linear region is expressed by the following formula (15):

$$Id = \cdot W \cdot (Cox/Leff) \cdot [\mu s/\{1+\mu s \cdot (Vd/Vmax)/Leff\}] \cdot Vd \cdot (Vg-Vth-Vd/2) \quad (15)$$

Threshold voltage Vth' in the FWD mode after the hot carrier stress can be expressed by the following formula (24) based on the relationship with the formula (2) in the embodiment 1:

$$Vth' = Vth - \Delta Vth = Vth - \Delta Vfb \quad (24)$$

Dependency θ' of the mobility on the vertical electric field in the FWD mode after the hot carrier stress can be expressed by the following formula (25) based on the embodiment 5, and the mobility U0' at Vg=Vth can be expressed by the following formula (26) based on the embodiment 6. Therefore, carrier mobility μs' after the hot carrier deterioration can be expressed by the following formula (27).

$$\theta' = \theta + \Delta\theta \quad (25)$$

$$U0' = \theta + \Delta\theta \quad (26)$$

$$\mu s' = U0'/\{1+\theta' \cdot (Vg-Vth')\} \quad (27)$$

Effective channel length Leff' after the hot carrier stress is expressed by the following formula (27.5) based on the embodiment 4:

$$Leff' = Leff - Let = Leff \cdot \{(\sigma+\Delta\sigma)/\sigma\}^{1/C2} \quad (27.5)$$

Therefore, drain current $Id'_{(FWD, LIN)}$ at the linear region in the FWD mode after the hot carrier stress is expressed by the following formula (28) using Vth' in the formula (24), μs' in the formula (27) and Leff in the formula (27.5):

$$Id'_{(FWD, LIN)} = W \cdot (Cox/Leff') \cdot [\mu s'/\{1 + \mu s' \cdot (Vd/Vmax)/Leff'\}] \cdot Vd \cdot (Vg - Vth' - Vd/2) \quad (28)$$

Accordingly, the drain current variation rate $\Delta Id'/Id_{(FWD, LIN)}$ at the linear region in the FWD mode after the hot carrier stress can be expressed by the following formula (29):

$$\Delta Id'_{(FWD, LIN)} = (Id'-Id)/Id = \mu s'/\mu s \cdot \{(\mu s \cdot Vd + Vmax \cdot Leff) / (\mu s' \cdot Vd + Vmax \cdot Leff')\} \cdot \{(Vg-Vth'-Vd/2)/(Vg-Vth-Vd/2)\} - 1 \quad (29)$$

The solid curves in the graph of FIG. 11 represent the results of simulation using the formula (29), and it can be seen that the results are accurately coincident with the results of actual measurement.

Thus, in the embodiment 7, the drain current Id at the linear region in the FWD mode after the hot carrier stress can be accurately simulated by using ΔVth, Δθ, ΔU0 and Leff' obtained by the formula (29) and the foregoing embodiments.

(Embodiment 8)

Figure 12:
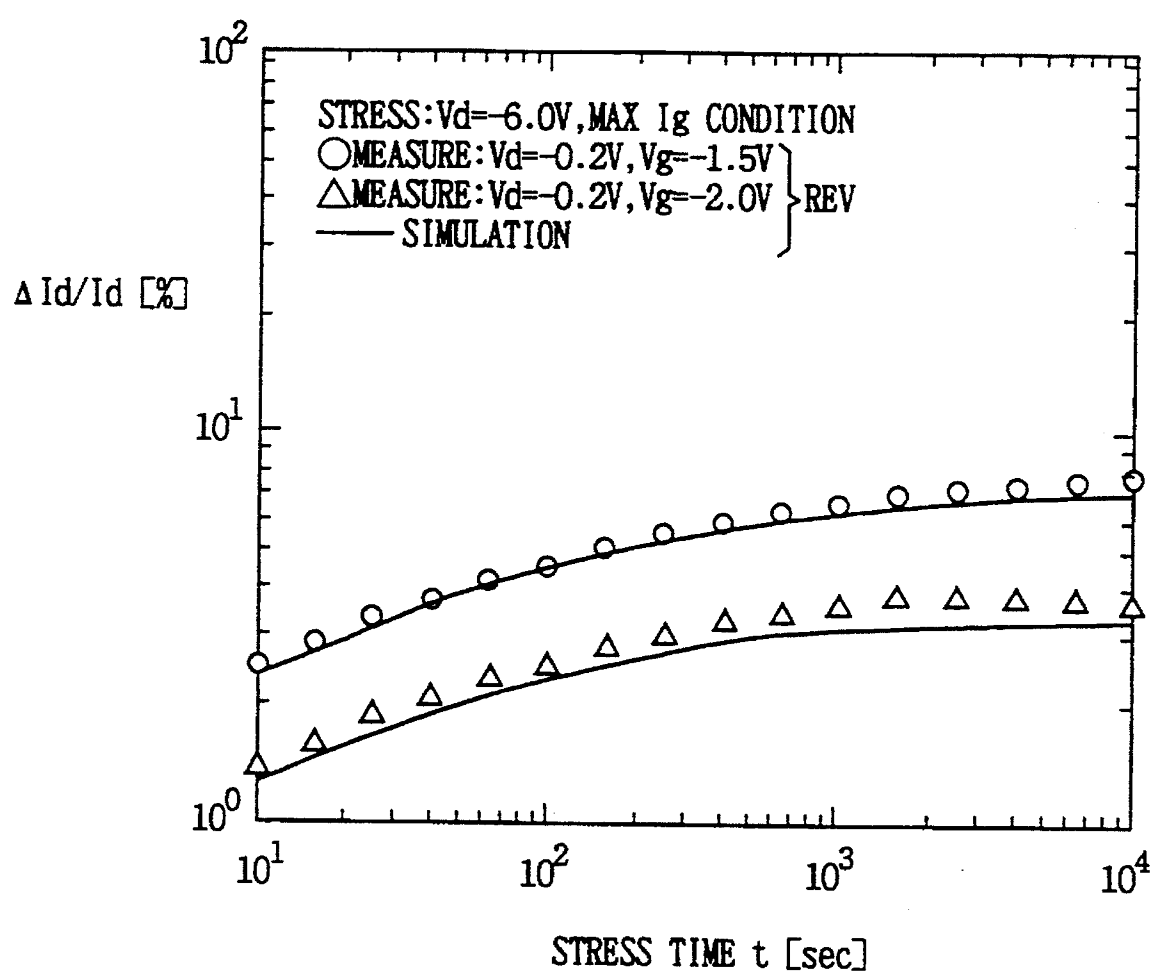
FIG. 12 is a graph showing a relationship between variation rate ΔId/Id of the drain current and the stress time at the linear region in the REV mode after the hot carrier stress in the P-MOS transistor.

In FIG. 12, a relationship between variation rate ΔId/Id of the drain current and the stress time at the linear region of the P-MOS transistor in the REV mode after the hot carrier stress is plotted on the Log-Log scale. In the graph of FIG. 12, the stress condition was that drain voltage Vd of −6.0V and gate voltage Vg achieving the maximum gate current were applied. Circular marks represent the results of measurement with Vd=−0.2V and Vg=−1.5V, and triangular marks represent the results of measurement with Vd=−0.2V and Vg=−2.0V. Solid curves represent the results obtained by the simulation. In connection with the REV mode after the hot carrier stress, formulas (15), (25), (26), (27) and (27.5) can also be utilized. In addition to these formulas, the threshold voltage Vth' after the hot carrier stress in the REV mode can be expressed by the following formula (30) based on the relationship between the formula (8) in the embodiment 2 and the formula (10) in the embodiment 3.

$$Vth' = Vth - \Delta Vth = Vth - \Delta Vfb - \Delta\sigma \cdot Vd = Vth - (1 + C1 \cdot Vd) \cdot \Delta Vfb \quad (30)$$

Therefore, drain current $Id'_{(REV, LIN)}$ at the linear region in the REV mode after the hot carrier stress can be expressed by the following formula (31) using Vth' in the formula (30), μs' in the formula (27) and Leff' in the formula (27.5).

$$Id'_{(REV, LIN)} = W \cdot (Cox/Leff') \cdot [\mu s'/\{1 + \mu s' \cdot (Vd/Vmax)/Leff'\}] \cdot Vd \cdot (Vg - Vth' - Vd/2) \quad (31)$$

As a result, variation rate $\Delta Id/Id_{(REV, LIN)}$ of the drain current at the linear region in the REV mode after the hot carrier stress is expressed by the following formula (32):

$$\Delta Id/Id_{(REV, LIN)} = (Id' - Id)/Id = Leff/Leff' \cdot (\mu s'/\mu s) \cdot \{(\mu s \cdot Vd + Vmax \cdot Leff)/(\mu s' \cdot Vd + Vmax \cdot Leff')\} \cdot \{(Vg - Vth' - Vd/2)/Vg - Vth - Vd/2)\} - 1 \quad (32)$$

Solid curves in the graph of FIG. 12 show the results of simulation using this formula (32), and it can be seen that the results are coincident with the results of actual measurement with high accuracy.

Thus, in the embodiment 8, the drain current at the linear region in the REV mode after the hot carrier stress can be accurately simulated by using ΔVth, Δθ, ΔU0 and Leff' obtained in the formula (32) and the foregoing embodiments.

(Embodiment 9)

Figure 13:
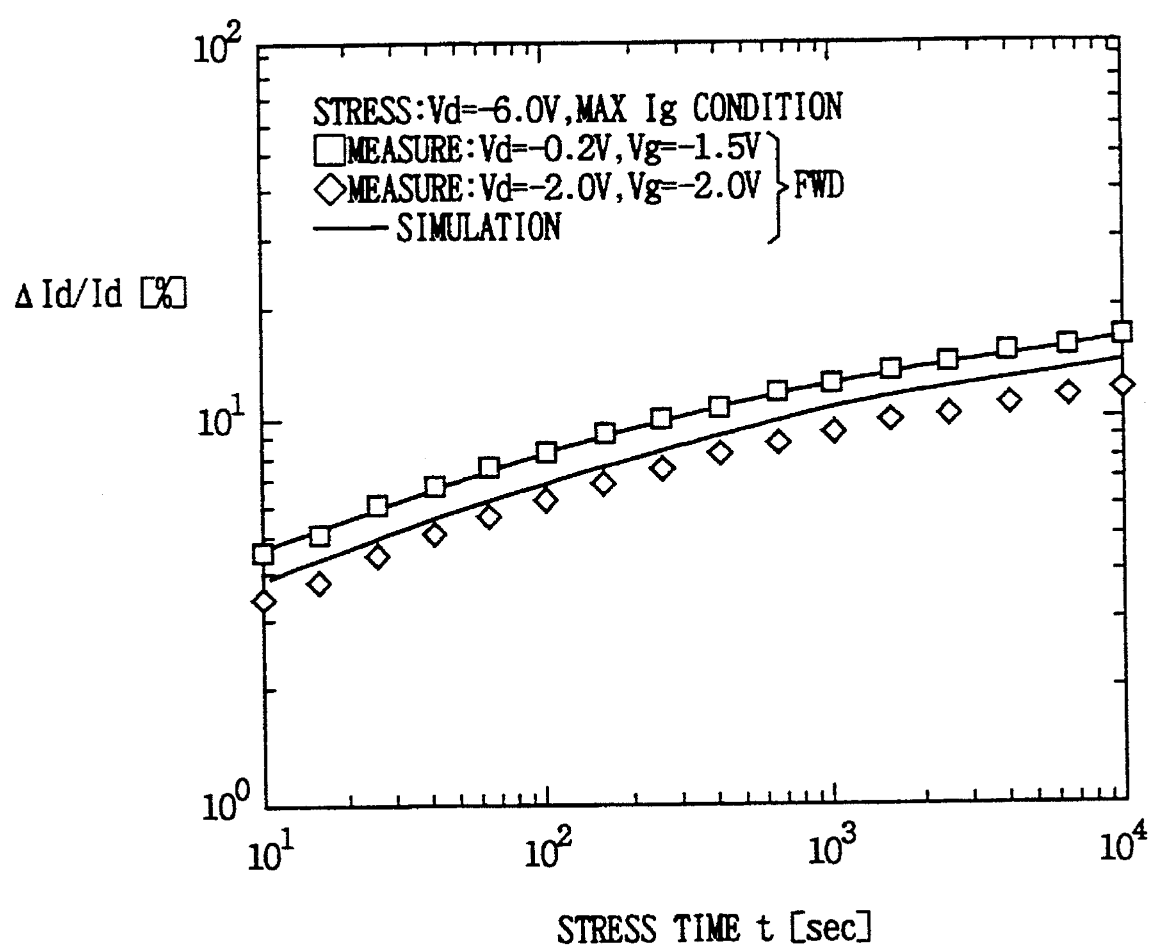
FIG. 13 is a graph showing a relationship between variation rate ΔId/Id of the drain current and the stress time at a saturation region in the FWD mode after the hot carrier stress in the P-MOS transistor.

In FIG. 13, a relationship between variation rate ΔId/Id of the drain current and the stress time at the saturation region in the FWD mode of the P-MOS transistor is plotted on the Log-Log scale. In the graph of FIG. 13, the stress condition was that drain voltage Vd of −6.0V and gate voltage Vg achieving the maximum gate current were applied. Square marks represent the results of measurement with Vd=−1.5V and Vg=−1.5V, and diamond-like marks represent the results of measurement with Vd=−2.0V and Vg=−2.0V. Solid curves represent the results obtained by the simulation.

It has been known that drain current Id in the saturation region is expressed by the following formula (33):

$$Id = W \cdot \{Cox/(Leff - \Delta L)\} \cdot [\mu s/\{1 + \mu s \cdot (Vdsat/Vmax)/(Leff - \Delta L)\}] \cdot Vdsat \cdot (Vg - Vth - Vdsat/2) \quad (33)$$

Saturation drain voltage Vdsat in the formula (33) is expressed by the following formula (34), and saturation speed region length ΔL is expressed by the following formula (35):

$$Vdsat=\{(Vg=Vth)\cdot Esat\cdot Leff\}/\{Esat\cdot Leff+(Vg-Vth)\} \quad (34)$$

$$\Delta L=k\cdot ln[\{(Vd-Vdsat)/k+Em\}/Esat] \quad (35)$$

Internal electric field Em in the formula (35) is expressed by the following formula (36), and k is expressed by the following formula (37) including a junction depth Xj and a gate oxide film thickness tox:

$$Em=\{(Vd-Vdsat)^2/k^2+Esat^2\}^{1/2} \quad (36)$$

$$k=0.2\cdot Kj^{1/2}\cdot tox^{1/3} \quad (37)$$

Threshold voltage Vth' in the FWD mode after the hot carrier stress is expressed by the formula (24), and mobility μs' is expressed by the formula (27). Saturation drain voltage Vdsat' in the FWD mode after the hot carrier stress is expressed by the following formula (38):

$$Vdsat'=\{(Vg-Vth-\Delta Vth)\cdot Esat\cdot Leff\}/\{Esat\cdot Leff+(Vg-Vth+\Delta Vth)\} \quad (38)$$

Therefore, drain current $Id'_{FWD,\ SAT)}$ at the saturation region in the FWD mode after the hot carrier stress is expressed by the following formula (39), using Vth' in the formula (24), μs' in the formula (27) and Vdsat' in the formula (38

$$Id'_{(FWD,SAT)} = W \cdot \{Cox/(Leff - \Delta L)\} \cdot [\mu s'/\{1 + \mu s' \cdot (Vdsat'/Vmax)/(Leff - \Delta L)\}] \cdot Vdsat' \cdot (Vg - Vth' - Vdsat'/2) \quad (39)$$

As a result, variation rate $\Delta Id/Id_{(FWD,\ SAT)}$ of the drain current at the saturation region in the FWD mode after the hot carrier stress is expressed by the following formula (40):

$$\begin{aligned}\Delta Id/Id_{(FWD,SAT)} &= (Id' - Id)/Id \\ &= (\mu s'/\mu s) \cdot [\{\mu s \cdot Vdsat + Vmax \cdot (Leff - \Delta L)\}/\{\mu s' \cdot Vdsat' + Vmax \cdot (Leff - \Delta L)\}] \cdot \{(Vg - Vth' - Vdsat'/2)/(Vg - Vth - Vdsat/2)\} \cdot (Vdsat'/Vdsat) - 1\end{aligned} \quad (40)$$

Solid curves in the graph of FIG. 13 represent the results of simulation using the formula (40), and it can be seen that the results are accurately coincident with the results of actual measurement. Thus, according to the embodiment 9, the drain current at the saturation mode in the FWD mode after the hot carrier stress can be accurately simulated by using ΔVth, Δθ and ΔU0 obtained in the foregoing embodiments and Vdsat' obtained in the formula (38) as well as the formula (40).

(Embodiment 10)

Figure 14:
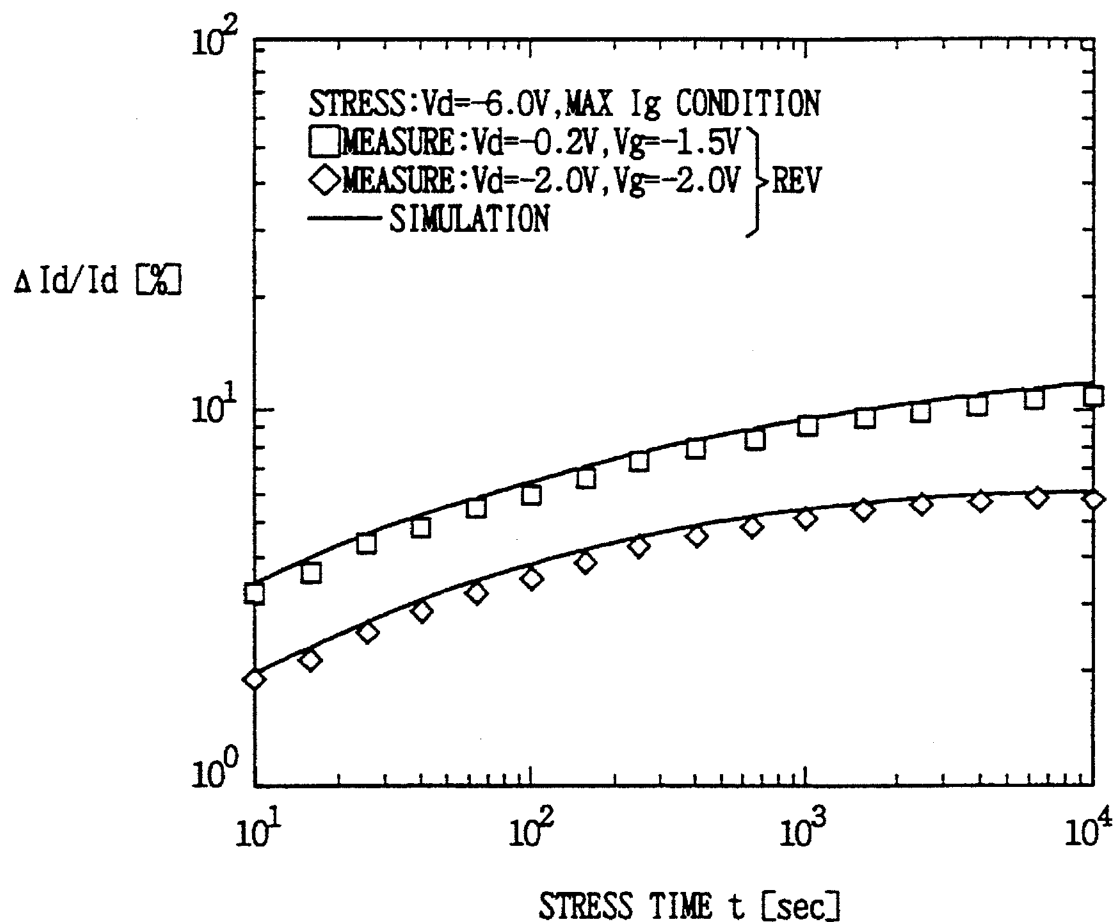
FIG. 14 is a graph showing a relationship between variation rate ΔId/Id of the drain current and the stress time at the saturation region in the REV mode after the hot carrier stress in the P-MOS transistor.

In FIG. 14, a relationship between variation rate ΔId/Id of the drain current and the stress time at the saturation region in the REV mode after the hot carrier stress of the P-MOS transistor is plotted on the Log-Log scale. In the graph of FIG. 14, the stress condition was that drain voltage Vd of −6.0V and gate voltage Vg achieving the maximum gate current were applied. Square marks represent the results of measurement with Vd=−1.5V and Vg=−1.5V, and diamond-like marks represent the results of measurement with Vd=−2.0V and Vg=−2.0V. Solid curves represent the results obtained by the simulation. Before application of the stress, as described before, saturation drain voltage Vdsat is expressed by the formula (34), and saturation measurement region length ΔL is expressed by the formula (35). At the same time, internal electric field Em is expressed by the formula (36), and k is expressed by the formula (37). Threshold voltage Vth' in the REV mode after the hot carrier stress is expressed by the formula (30), and mobility μs' is expressed by the formula (27).

Effective channel length Leff' in the REV mode after the hot carrier stress is expressed by the formula (27.5), and saturation drain voltage Vdsat' is expressed by the following formula (41).

$$Vdsat'=\{(Vg-Vth-\Delta Vth)\cdot Esat\cdot Leff'\}/\{Esat\cdot Leff'+(Vg-Vth+\Delta Vth)\} \quad (41)$$

Therefore, drain current $Id'_{(REV,\ SAT)}$ at the saturation region in the REV mode after the hot carrier stress is expressed by the following formula (42) using Vth' in the formula (30), μs' in the formula (27), Leff' in the formula (27.5) and Vdsat' in the formula (41).

$$Id'_{(REV,SAT)} = W \cdot \{Cox/(Leff' - \Delta L)\} \cdot [\mu s'/\{1 + \mu s' \cdot (Vdsat'/Vmax)/(Leff' - \Delta L)\}] \cdot Vdsat' \cdot (Vg - Vth' - Vdsat'/2) \quad (42)$$

Consequently, the variation rate $\Delta Id/Id_{(REV,\ SAT)}$ of the drain current at the saturation region in the REV mode after the hot carrier stress is expressed by the following formula (43):

$$\begin{aligned}\Delta Id/Id'_{(REV,\,SAT)} &= (Id' - Id)/Id \quad (43)\\ &= (\mu s'/\mu s)\cdot\{(Leff - \Delta L)/(Leff' - \Delta L)\}\cdot\\ &\quad [\{\mu s'\cdot(Vdsat'/Vmax\cdot(Leff' - \Delta L)\}/\\ &\quad (\mu s'\cdot Vdsat' + Vmax\cdot(Leff' - \Delta L)\}]\cdot\\ &\quad \{(Vg - Vth' - Vdsat'/2)/\\ &\quad (Vg - Vth' - Vdsat'/2)\}\cdot\\ &\quad (Vdsat'/Vdsat) - 1\end{aligned}$$

Solid curves in the graph of FIG. 14 represent the results of simulation using the formula (43), and it can be seen that the results are accurately coincident with the results of actual measurement.

Thus, according to the embodiment 10, the drain current at the saturation region in the REV mode after the hot carrier stress can be accurately simulated by using ΔVth, Δθ, ΔUO and Leff' obtained in the foregoing embodiments, and Vdsat' obtained in the formula (41) as well as the formula (43).

As described hereinbefore, the invention can provide the method by which it is possible to simulate accurately the hot carrier deterioration of various transistor characteristics in the FWD and REV modes after the hot carrier stress of the P-MOS transistor.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of simulating hot carrier deterioration of a P-MOS transistor utilizing the following formulas (A1), (A2), (A3) and (A4) in an FWD mode that a direction of current flow between source/drain during application of a stress in a transistor is the same as that during measuring of transistor characteristics:

$$Vth=Vfb+\sigma\bullet Vd \quad (A1)$$

$$\Delta Vth=\Delta Vfb \quad (A2)$$

$$(\Delta Vfb)_f=A\bullet\tau^n \quad (A3)$$

$$\tau=B\bullet(Ig/W)^{-m} \quad (A4)$$

where Vth represents a threshold voltage, Vd represents a drain voltage, Vfb represents a threshold voltage at Vd=0V, Ig represents a gate current, W represents a gate width, ΔVth and ΔVfb represent variations of Vth and Vfd caused by hot carrier deterioration, respectively, σ represents a coefficient showing an effect of lowering of an oxide film barrier caused by Vd, a lifetime τ of the transistor is defined by the formula (A3), and $(\Delta Vfb)_f$ represents a particular value of ΔVfb, wherein the coefficients A, n, B and m are determined by a preliminary measuring experiment, whereby the transistor lifetime τ can be estimated.

2. A method of simulating hot carrier deterioration of a P-MOS transistor utilizing the following formulas (A1), (A5), (A3) and (A4) in an REV mode that a direction of current flow between source/drain during application of a stress in a transistor is opposite to that during measuring of transistor characteristics:

$$Vth=Vfb+\sigma\bullet Vd \quad (A1)$$

$$\Delta Vth=\Delta Vfb+\Delta\sigma\bullet Vd \quad (A5)$$

$$(\Delta Vfb)_f=A\bullet\tau^n \quad (A3)$$

$$\tau=B\bullet(Ig/W)^{-m} \quad (A4)$$

where Vth represents a threshold voltage, Vd represents a drain voltage, Vfb represents a threshold voltage at Vd=0V, Ig represents a gate current, W represents a gate width, σ represents a coefficient showing an effect of lowering of an oxide film barrier caused by Vd, ΔVth, ΔVfb and Δσ represent variations of Vth, Vfd and σ caused by the hot carrier deterioration, respectively, a lifetime τ of a transistor is defined by the formula (A3), and $(\Delta Vfb)_f$ represents a particular value of ΔVfb, wherein the coefficients A, n, B and m are determined by a preliminary measuring experiment, whereby the transistor lifetime τ can be estimated.

3. A method of simulating hot carrier deterioration of a P-MOS transistor utilizing the following formulas (A5), (A6) and (A7) in an REV mode that a direction of current flow between source/drain during application of a stress in a transistor is opposite to that during measuring of transistor characteristics:

$$\Delta Vth=\Delta Vfb+\Delta\sigma\bullet Vd \quad (A5)$$

$$\Delta\sigma=C1\bullet\Delta Vfb \quad (A6)$$

$$\Delta Vth=(1+C1\bullet Vd)\bullet\Delta Vfb \quad (A7)$$

where Vth represents a threshold voltage, Vd represents a drain voltage, Vfb represents a threshold voltage at vd=0V, o represents a coefficient showing an effect of lowering of an oxide film barrier caused by Vd, and ΔVth, ΔVfb and Δσ represent variations of Vth, Vfd and σ caused by the hot carrier deterioration, respectively, wherein the coefficient C1 is determined by a preliminary measuring experiment, whereby the the hot carrier deterioration ΔVth can be estimated.

4. A method of simulating hot carrier deterioration of a P-MOS transistor utilizing the following formulas (A5), (A8) and (A9):

$$\Delta Vth=\Delta Vfb+\Delta\sigma\bullet Vd \quad (A5)$$

$$Leff\propto\sigma^{1/C2} \quad (A8)$$

$$Leff'=Leff-Let=Leff\bullet\{(\sigma+\Delta\sigma)/\sigma\}^{1/C2} \quad (A9)$$

where Vth represents a threshold voltage, Vd represents a drain voltage, Vfb represents a threshold voltage at Vd=0V, σ represents a coefficient showing an effect of lowering of an oxide film barrier caused by Vd, ΔVth, ΔVfb and Δσ represent variations of Vth, Vfd and σ caused by the hot carrier deterioration, respectively, Leff represents an effective channel length before application of the stress, Leff' represents an effective channel length after shortening caused by the hot carrier deterioration, and Let represents the shortening of the channel length, wherein the coefficient C2 is determined by a preliminary measuring experiment, whereby the shortening Let of the channel length caused by the hot carrier deterioration can be estimated.

5. A method of simulating hot carrier deterioration of a P-MOS transistor utilizing any one of the following formulas (A2) and (A5):

$$\Delta Vth=Vfb \quad (A2)$$

$$\Delta Vth=\Delta Vfb+\Delta\sigma\bullet Vd \quad (A5)$$

and further utilizing the following formulas (A10) and (A11):

$$\mu s = U0/\{1+\theta(Vg-Vth)\} \quad (A10)$$

$$\Delta\theta = C3 \cdot \Delta Vfb \quad (A11)$$

where Vth represents a threshold voltage, Vd represents a drain voltage, Vfb represents a threshold voltage at Vd=0V, σ represents a coefficient showing an effect of lowering of an oxide film barrier caused by Vd, Vg represents a gate voltage, ΔVth, ΔVfb and Δσ represent variations of Vth, Vfd and a caused by the hot carrier deterioration, respectively, μs represents a mobility of a carrier, U0 represents a mobility at Vg=Vth, θ represents dependency of μs on a vertical electric field, and Δθ represents variation of θ caused by the hot carrier deterioration, wherein the coefficient C3 is determined by a preliminary measuring experiment, whereby the variation Δθ of θ caused by the hot carrier deterioration can be estimated.

6. A method of simulating hot carrier deterioration of a P-MOS transistor utilizing any one of the following formulas (A2) and (A5):

$$\Delta Vth = \Delta Vfb \quad (A2)$$

$$\Delta Vth = \Delta Vfb + \Delta\sigma \cdot Vd \quad (A5)$$

and further utilizing the following formulas (A10) and (A12):

$$\mu s = U0/\{1+\theta(Vg-Vth)\} \quad (A10)$$

$$\Delta U0 = C4 \cdot \Delta Vfb \quad (A12)$$

where Vth represents a threshold voltage, Vd represents a drain voltage, Vfb represents a threshold voltage at Vd=0V, μs represents a mobility of a carrier, θ represents dependency of μs on a vertical electric field, σ represents a coefficient showing an effect of lowering of an oxide film barrier caused by Vd, U0 represents a mobility at Vg=Vth, and ΔVth, ΔVfb, ΔU0, Δσ and Δθ represent variations of Vth, Vfd, U0, σ and θ caused by the hot carrier deterioration, respectively, wherein the coefficient C4 is determined by a preliminary measuring experiment, whereby the variation ΔU0 of U0 caused by the hot carrier deterioration can be estimated.

7. A method of simulating hot carrier deterioration of a P-MOS transistor utilizing the following formulas (A2), (A8), (A9), (A10), (A11), (A12), (A13), (A14a), (A15), (A16) and (A17) in an FWD mode that a direction of current flow between source/drain during application of a stress in a transistor is the same as that during measuring of transistor characteristics:

$$\Delta Vth = \Delta Vfb \quad (A2)$$

$$Leff \propto \sigma^{1/C2} \quad (A8)$$

$$Leff' = Leff - Let = Leff \cdot \{(\sigma+\Delta\sigma)/\sigma\}^{1/C2} \quad (A9)$$

$$\mu s = U0/\{1+\theta(Vg-Vth)\} \quad (A10)$$

$$\Delta\theta = C3 \cdot \Delta Vfb \quad (A11)$$

$$\Delta U0 = C4 \cdot \Delta Vfb \quad (A12)$$

$$Id' = W \cdot (Cox/Leff') \cdot [\mu s'/\{1+\mu s' \cdot (Vd/Vmax)/Leff'\}] \cdot Vd \cdot (Vg - Vth' - Vd/2) \quad (A13)$$

$$Vth' = Vth - \Delta Vfb \quad (A14a)$$

$$\mu s' = (U0+\Delta U0)/\{1+(\theta+\Delta\theta) \cdot (Vg-Vth')\} \quad (A15)$$

$$= (U0+C4 \cdot \Delta Vfb)/\{1+(\theta+C3 \cdot \Delta Vfb) \cdot (Vg-Vth')\} \quad (A16)$$

$$\Delta Id = Id' - Id \quad (A17)$$

where Vth represents a threshold voltage, Vd represents a drain voltage, Vfb represents a threshold voltage at Vd=0V, μs represents a mobility of a carrier, θ represents dependency of the mobility on a vertical electric field, U0 represents a mobility at Vg=Vth, W represents a gate width, Cox represents a capacitance of a gate oxide film, Leff represents an effective channel length, Vmax represents a saturation speed, Id represents a drain current, Id' represents a drain current at a linear region after the hot carrier deterioration, and Leff', μs' and Vth' represent Leff, μs and Vth after the hot carrier deterioration, respectively, wherein the coefficients C2, C3 and C4 are determined by a preliminary measuring experiment, whereby the variation ΔId of the drain current at the linear region in the FWD mode after the hot carrier deterioration can be estimated.

8. A method of simulating hot carrier deterioration of a P-MOS transistor utilizing the following formulas (A5), (A6), (A8), (A9), (A10), (A11), (A12), (A14b), (A16) (A17) and (A18) in an REV mode that a direction of current flow between source/drain during application of a stress in a transistor is opposite to that during measuring of transistor characteristics:

$$\Delta Vth = \Delta Vfb + \Delta\sigma \cdot Vd \quad (A5)$$

$$\Delta\sigma = C1 \cdot \Delta Vfb \quad (A6)$$

$$Leff \propto \sigma^{1/C2} \quad (A8)$$

$$Leff' = Leff - Let = Leff \cdot \{(\sigma+\Delta\sigma)/\sigma\}^{1/C2} \quad (A9)$$

$$\mu s = U0/\{1+\theta(Vg-Vth)\} \quad (A10)$$

$$\Delta\theta = C3 \cdot \Delta Vfb \quad (A11)$$

$$\Delta U0 = C4 \cdot \Delta Vfb \quad (A12)$$

$$Vth' = Vth - \Delta Vfb \cdot (1 + C1 \cdot Vd) \quad (A14b)$$

$$\mu s' = (U0+C4 \cdot \Delta Vfb)/\{1+(\theta+C3 \cdot \Delta Vfb) \cdot (Vg-Vth')\} \quad (A16)$$

$$\Delta Id = Id' - Id \quad (A17)$$

$$Id' = W \cdot (Cox/Leff') \cdot [\mu s'/\{1+\mu s' \cdot (Vd/Vmax)/Leff'\}] \cdot Vd \cdot (Vg - Vth' - Vd/2) \quad (A18)$$

where Vth represents a threshold voltage, Vd represents a drain voltage, Vfb represents a threshold voltage at Vd=0V, Vg represents a gate voltage, W represents a gate width, σ represents a coefficient showing an effect of lowering of an oxide film barrier caused by Vd, Id' represents a drain current at a linear region after the hot carrier deterioration, Cox represents a capacitance of a gate oxide film, Leff represents an effective channel length, μs represents a mobility of a carrier, Vmax represents a saturation speed, and Leff', μs' and Vth' represent Leff, μs and Vth after the hot carrier deterioration, respectively, wherein the coefficients C1, C2, C3 and C4 are determined by a preliminary measuring experiment, whereby the variation ΔId of the drain current at the linear region in the REV mode after the hot carrier deterioration can be estimated.

9. A method of simulating hot carrier deterioration of a P-MOS transistor utilizing the following formulas (A2), (A10), (A11), (A12), (A17), (A19), (A20), (A21), (A22) and (A23) in an FWD mode that a direction of current flow between source/drain during application of a stress in a transistor is the same as that during measuring of transistor characteristics:

$$\Delta Vth=\Delta Vfb \quad (A2)$$

$$\mu s=U0/\{1+\theta(Vg-Vth)\} \quad (A10)$$

$$\Delta\theta=C3\bullet\Delta Vfb \quad (A11)$$

$$\Delta U0=C4\bullet\Delta Vfb \quad (A12)$$

$$\Delta Id=Id'-Id \quad (A17)$$

$$Id'=W\cdot\{Cox/(Leff-\Delta L)\}\cdot[\mu s'/\{1+\mu s'\cdot(Vdsat'/Vmax)/(Leff-\Delta L)\}]\cdot Vdsat'\cdot(Vg-Vth'-Vdsat'/2) \quad (A19)$$

$$Vdsat'=\{(Vg-Vth-\Delta Vth)\bullet Esat\bullet Leff\}/\{Esat\bullet Leff+(Vg-Vth+\Delta Vth)\} \quad (A20)$$

$$\Delta L=k\bullet ln[\{(Vd-Vdsat)/k+Em\}/Esat] \quad (A21)$$

$$Em=\{(Vd-Vdsat)^2/k^2+Esat^2\}^{1/2} \quad (A22)$$

$$k=0.2\bullet Xj^{1/2}\bullet tox^{1/3} \quad (A23)$$

where Vth represents a threshold voltage, Vd represents a drain voltage, Vfb represents a threshold voltage at Vd=0V, Vg represents a gate voltage, μs represent a mobility of a carrier, U0 represents a mobility at Vg=Vth, θ represents dependency of the mobility on a vertical electric field, Id' represents a drain current at a saturation region after the hot carrier deterioration, W represents a gate width, Cox represents a capacitance of a gate oxide film, Leff represents an effective channel length, μs' and Vth' represent the mobility of the carrier and the threshold voltage after the hot carrier deterioration, respectively, Vmax represents a saturation speed, ΔL represents a saturation speed region length, Em represents an internal electric field, Esat represents a saturation electric field, Xj represents a junction depth, tox represents a thickness of a gate oxide film, and Vdsat' represents a saturation drain voltage Vdsat after the hot carrier deterioration, wherein the coefficients C3 and C4 are determined by a preliminary measuring experiment, whereby the variation ΔId of the drain current at the saturation region in the FWD mode after the hot carrier deterioration can be estimated.

10. A method of simulating hot carrier deterioration of a P-MOS transistor utilizing the following formulas (A5), (A6), (A8), (A9), (A10), (A11), (A12), (A17), (A24) and (A25) in an REV mode that a direction of current flow between source/drain during application of a stress in a transistor is opposite to that during measuring of transistor characteristics:

$$\Delta Vth=\Delta Vfb+\Delta\sigma\bullet Vd \quad (A5)$$

$$\Delta\sigma=C1\bullet\Delta Vfb \quad (A6)$$

$$Leff\propto\sigma^{1/C2} \quad (A8)$$

$$Leff'=Leff-Let=Leff\bullet\{(\sigma+\Delta\sigma)/\sigma\}^{1/C2} \quad (A9)$$

$$\mu s=U0/\{1+\theta(Vg-Vth)\} \quad (A10)$$

$$\Delta\theta=C3\bullet\Delta Vfb \quad (A11)$$

$$\Delta U0=C4\bullet\Delta Vfb \quad (A12)$$

$$\Delta Id=Id'-Id \quad (A17)$$

$$Id'=W\cdot\{Cox/(Leff-\Delta L)\}\cdot[\mu s'/\{1+\mu s'\cdot(Vdsat'/Vmax)/(Leff-\Delta L)\}]\cdot(Vg-Vth'-Vdsat'/2) \quad (A24)$$

$$Vdsat'=\{(Vg-Vth-\Delta Vth)\bullet Esat\bullet Leff'\}/\{Esat\bullet Leff'+(Vg-Vth+\Delta Vth)\} \quad (A25)$$

where Vth represents a threshold voltage, Vd represents a drain voltage, Vfb represents a threshold voltage at Vd=0V, Vg represents a gate voltage, σ represents a coefficient showing an effect of lowering of an oxide film barrier caused by Vd, μs represents a mobility of a carrier, U0 represents a mobility at Vg=Vth, θ represents dependency of the mobility on a vertical electric field, and Id', μs', Vth', Leff' and Vdsat' represent a saturation drain current, a carrier mobility, a threshold voltage, an effective channel length and a saturation drain voltage after the hot carrier deterioration, respectively, W represents a gate width, Cox represents a capacitance of a gate oxide film, Leff represents an effective channel length before application of a stress, ΔL represents a saturation speed region length, Vmax represents a saturation speed, Let represents shortening of the channel length, and Esat represent a saturation electric field, wherein the coefficients C1, C2, C3 and C4 are determined by a preliminary measuring experiment, whereby the variation ΔId of the drain current at the saturation region in the REV mode after the hot carrier deterioration can be estimated.

* * * * *

UNITED STATES PATENT AND TRADEMARK OFFICE

CERTIFICATE OF CORRECTION

PATENT NO. : 5,615,377

DATED : March 25, 1997

INVENTOR(S) : Satoshi Shimizu et al

It is certified that error appears in the above-indentified patent and that said Letters Patent is hereby corrected as shown below:

In the Drawing:

In Figs. 13 and 14, "Vd=-0.2V" should be corrected to --Vd=-1.5V--;

Column 1, line 23, "tr.ansistor" should be corrected to --transistor--;

Column 1, line 41 and column 7, lines 1 and 36, "AVth" should be corrected to ΔVth--;

Column 2, line 33, formula (106), "$W^{-m}$" should be corrected to --$W^{m}$--;

Column 2, line 40, formula (108), "$^{A}$Id" should be corrected to --ΔId/Id-- and "$W^{-mn}$" should be corrected to --$W^{-mn}$--;

Column 2, line 41, formula (109), "$^{A}$Vth" should be corrected to --$\Delta V_{th}$--;

Column 2, line 47, formula (110), "$W^{-mn}$" should be corrected to --$W^{-mn}$--;

Column 3, line 24, "Si" should be corrected to --S1--;

Column 3, lines 28 and 30 and column 4, line 1, "BSI" should be corrected to --BSIM--;

Column 4, lines 38 and 65, column 15, line 48, column 16, lines 8, 30 and 48, and column 17, lines 8

UNITED STATES PATENT AND TRADEMARK OFFICE
CERTIFICATE OF CORRECTION

PATENT NO. : 5,615,377

DATED : March 25, 1997

INVENTOR(S) : Satoshi Shimizu et al.

It is certified that error appears in the above-identified patent and that said Letters Patent is hereby corrected as shown below:

and 38 "Vfd" should be corrected to --$^{V}$fb--;

Column 6, line 64, "effect u by" should be corrected to --effect σ by--;

Column 7, line 8, "Fig. 3V should be corrected to --Fig. 3--;

Column 7, line 40, formula (7), first and second "$\Delta V_{th}$" should be corrected to --$\Delta^{V}$fb--;

Column 8, line 23, "current" should be corrected to --voltage--;

Column 12, line 6, "ΔId'/Id" should be corrected to --ΔId/Id--;

Column 12, line 11, formula (29), "ΔId'" should be corrected to --ΔId/Id--;

Column 13, line 32, formula (34), "(Vg= Vth)" should be corrected to --($Vg-V_{th}$)--;

Column 13, line 51, formula (38), column 14 line 50, formula (41), column 19, line 18, formula (A20), and column 20, line 25, formula (A25), "($Vg-V_{th}-\Delta V_{th}$)" should be corrected to --($V_g-V_{th}+\Delta V_{th}$)--";

Column 16, line 27, "vd=0V" should be corrected to --Vd=OV--;

CERTIFICATE OF CORRECTION

PATENT NO. : 5,615,377

DATED : March 25, 1997

INVENTOR(S) : Satoshi Shimizu et al.

It is certified that error appears in the above-identified patent and that said Letters Patent is hereby corrected as shown below:

Column 16, line 28, "o represent" should be corrected to --σ represent--; and

Column 17, line 9, "and a caused" should be corrected to --and σ caused--.

Column 7, line 36, "AVfb" should be corrected to -- ΔVfb --.

Signed and Sealed this

Eleventh Day of November, 1997

Attest:

BRUCE LEHMAN

Attesting Officer

Commissioner of Patents and Trademarks